United States Patent
Sasaki et al.

(10) Patent No.: US 11,535,934 B2
(45) Date of Patent: Dec. 27, 2022

(54) VAPORIZER

(71) Applicant: Hitachi Metals, Ltd., Tokyo (JP)

(72) Inventors: Akira Sasaki, Mie (JP); Yoshinori Yoshida, Mie (JP)

(73) Assignee: Hitachi Metals, Ltd., Tokyo (JP)

( * ) Notice: Subject to any disclaimer, the term of this patent is extended or adjusted under 35 U.S.C. 154(b) by 606 days.

(21) Appl. No.: 16/486,404

(22) PCT Filed: Feb. 20, 2018

(86) PCT No.: PCT/JP2018/005866
§ 371 (c)(1),
(2) Date: Aug. 15, 2019

(87) PCT Pub. No.: WO2018/179999
PCT Pub. Date: Oct. 4, 2018

(65) Prior Publication Data
US 2020/0109471 A1    Apr. 9, 2020

(30) Foreign Application Priority Data
Mar. 29, 2017  (JP) .............................. JP2017-065154

(51) Int. Cl.
*H01L 21/67*    (2006.01)
*C23C 16/448*   (2006.01)

(52) U.S. Cl.
CPC .... *C23C 16/4481* (2013.01); *H01L 21/67017* (2013.01); *H01L 21/67253* (2013.01)

(58) Field of Classification Search
CPC ............ C23C 16/45561; C23C 16/448; C23C 16/4481; H01L 21/67253; H01L 21/31; H01L 21/67017
See application file for complete search history.

(56) References Cited

U.S. PATENT DOCUMENTS 10,480,069 B2 * 11/2019 Kitagawa ............... H01L 21/31
2018/0291502 A1 * 10/2018 Kitagawa ............... C23C 16/52

FOREIGN PATENT DOCUMENTS

JP         08064541 A    3/1996
JP       2009161814 A    7/2009
(Continued)

OTHER PUBLICATIONS

Japanese Patent Office, "International Search Report and Written Opinion Regarding International Application No. PCT/JP2018/005866", dated Apr. 24, 2018, p. 8, Published in: JP.

(Continued)

*Primary Examiner* — Nikolay K Yushin

(74) *Attorney, Agent, or Firm* — Neugeboren O'Dowd PC

(57) ABSTRACT

A vaporizer includes a tank in which liquid material is heated to generate gas, a cabinet which houses the tank, and a conduit which supplies the gas to the outside of the cabinet. The vaporizer also includes a flow rate measuring means which measures a flow rate of the gas flowing through said conduit, and a heater plate which heats the conduit. The cabinet comprises a detachable panel that is a panel which can be removed. A first support member is fixed directly or indirectly to said cabinet at a position other than said detachable panel, the flow rate measuring means is supported by said first support member, and the heater plate is supported between said flow rate measuring means and said detachable panel by said first support member.

17 Claims, 12 Drawing Sheets

(56) References Cited

FOREIGN PATENT DOCUMENTS

JP        2009527905 A    7/2009
JP        2016191140 A    11/2016

OTHER PUBLICATIONS

Sasaki, Akira, "Vaporizer With Higher Applicable Temperature", "Hitachi Metals Technical Review", 2012, p. 4, Published in: JP.

\* cited by examiner (a)

(b)

(a)

(b)

VAPORIZER

BACKGROUND

Field

This invention relates to a vaporizer which supplies gas to a semiconductor producing apparatus.

Background

A vaporizer is an apparatus used for the purpose of supplying gas generated by heating material which is in a liquid phase state at an ordinary temperature (which may be referred to as "liquid material" hereafter) to a semiconductor producing apparatus. The vaporizer is constituted by a tank, in which liquid material is heated to generate gas, a valve which starts and stops supply of the gas generated in the tank and a flow rate measuring means for measuring a flow rate of the gas (refer to Japanese Patent Application Laid-Open (kokai) No. H08-64541, for example). Moreover, for the purpose of efficiently evaporating new liquid material used in a semiconductor manufacturing process, a vaporizer which can heat liquid material to temperature higher than 150° C. has been developed (refer to Akira Sasaki, "Vaporizer with Higher Applicable Temperature", Hitachi Metals Technical Review, Pages 26-29, Volume 28, 2012, for example).

FIG. 11 is a schematic right side view for showing an example of a configuration of a vaporizer 1a according to a prior art. Moreover, FIG. 12 is a perspective view for showing an example of the configuration of the vaporizer 1a. However, in order to make it easier to understand the configuration of the vaporizer 1a, a part of a tank 2 and a cabinet 3 are omitted in FIG. 12. As shown in these drawings, the vaporizer 1a comprises the tank 2, the cabinet 3 which houses the tank 2, a conduit 4 which supplies the gas generated in the tank 2 to the outside, a valve 8 prepared in the conduit 4, and a flow rate measuring means 5 which measures a flow rate of the gas flowing through the conduit 4. Liquid material stored in the tank 2 is heated and evaporated by a tank heater 2a. The generated gas is supplied to a semiconductor producing apparatus through the valve 8 and the flow rate measuring means 5 by the conduit 4.

When the temperature of the conduit 4 is lower than the temperature of the liquid material in the tank 2, there is a possibility that the gas may be condensed and returned to liquid in the inside of the conduit 4. Specifically, when the temperature of the conduit 4 is lower than the dew point of the gas generated from the liquid material, there is a possibility that the gas may be condensed and returned to liquid in the inside of the conduit 4. For the purpose of preventing this, the conduit 4 is heated and kept warm (or hot) by a heater plate 7. The heater plate 7 is being fixed to a mounting panel 3c of the cabinet 3, and the flow rate measuring means 5 and the valve 8 are supported by the heater plate 7 through a flow rate measuring means fixing base 5b and a valve fixing base 8b, respectively.

By the way, there is a case where the flow rate measuring means 5 and/or the valve 8 must be removed from the vaporizer 1a for the purpose of inspection or repair of the vaporizer 1a, etc., for example. In the vaporizer 1a according to the prior art, the mounting panel 3c of the cabinet 3 is fixed to the surface of a wall. Moreover, other vaporizers, in which different kinds of liquid material are stored, are fixed adjacent to the side surfaces of the cabinet 3 in many cases. Therefore, in such a case, the detachable panel 3b that is a removable panel of the cabinet 3 needs to be removed to expose the flow rate measuring means 5 and the valve 8 and fixtures, such as screws, which fix the flow rate measuring means 5 and the valve 8 to the heater plate 7, needs to be removed using a tool, such as a screwdriver.

SUMMARY

According to an aspect, a vaporizer includes a tank in which liquid material is heated to generate gas, a cabinet which houses the tank, and a conduit which supplies the gas to the outside of the cabinet. The vaporizer also includes a flow rate measuring means which measures a flow rate of the gas flowing through said conduit, and a heater plate which heats the conduit. The cabinet comprises a detachable panel that is a panel which can be removed. A first support member is fixed directly or indirectly to said cabinet at a position other than said detachable panel, the flow rate measuring means is supported by said first support member, and the heater plate is supported between said flow rate measuring means and said detachable panel by said first support member.

According to another aspect, a vaporizer comprises a first support member fixed to a cabinet, and has a configuration in which a flow rate measuring means is supported by the first support member and a heater plate is supported between the flow rate measuring means and a detachable panel that is a removable panel of the cabinet by the first support member. The vaporizer further comprises one or more heat conducting members which conducts heat to a conduit from the heater plate.

DETAILED DESCRIPTION

Technical Problem

As mentioned above, in a semiconductor producing apparatus, a plurality of vaporizers, in which different kinds of liquid material are stored, are fixed side by side adjacent to each other on a wall surfaces in many cases. For this reason, there is a demand to decrease the whole width by narrowing the width in a horizontal direction of each of the vaporizers when viewed from the front. Moreover, there is also a demand to reduce the number of vaporizer to be installed, by preparing a plurality of gas supply lines sharing a common tank in the inside of one vaporizer.

Figure 11:
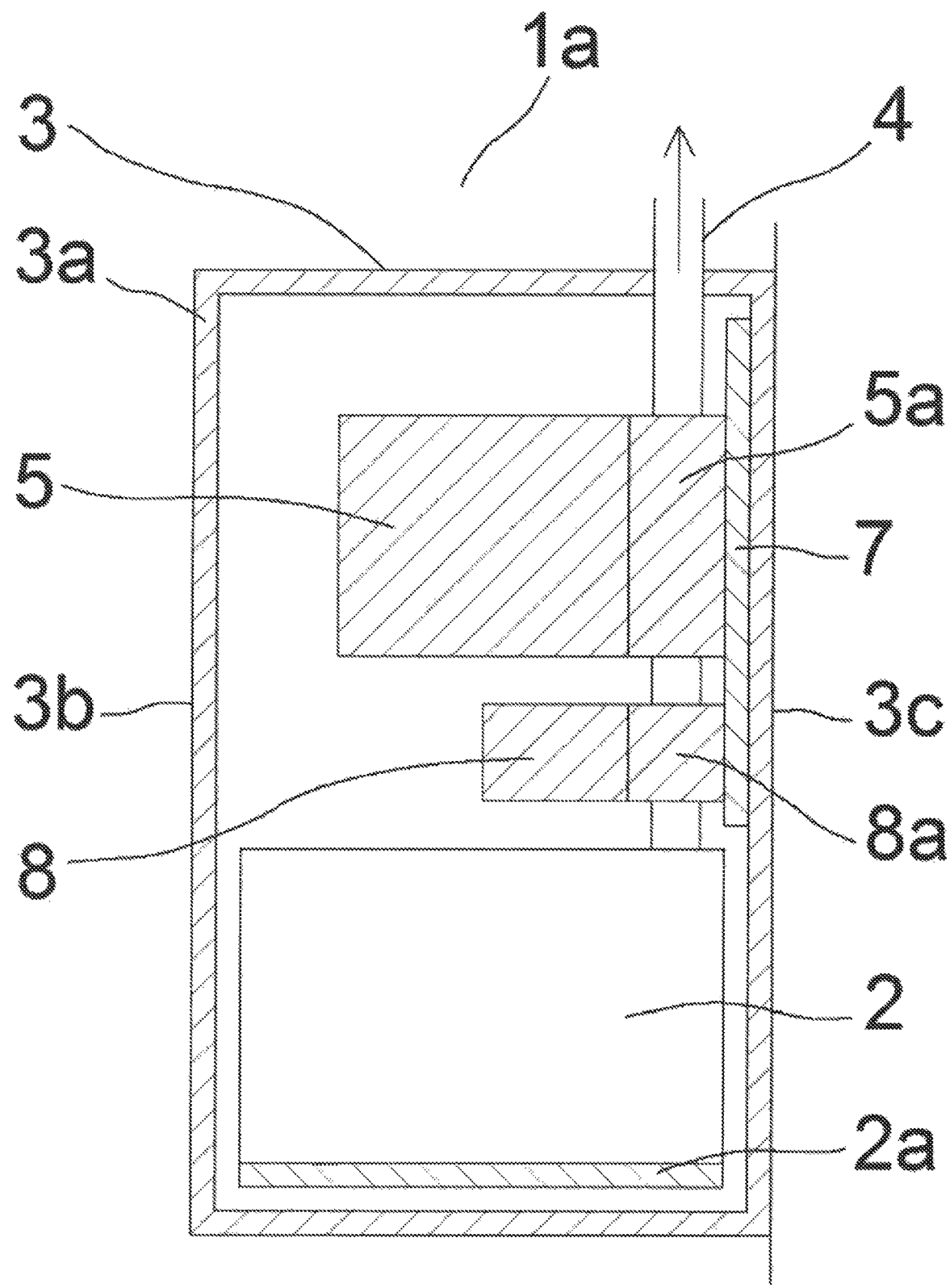
FIG. 11 is a schematic right side view for showing an example of a configuration of a vaporizer according to a prior art.
Figure 12:
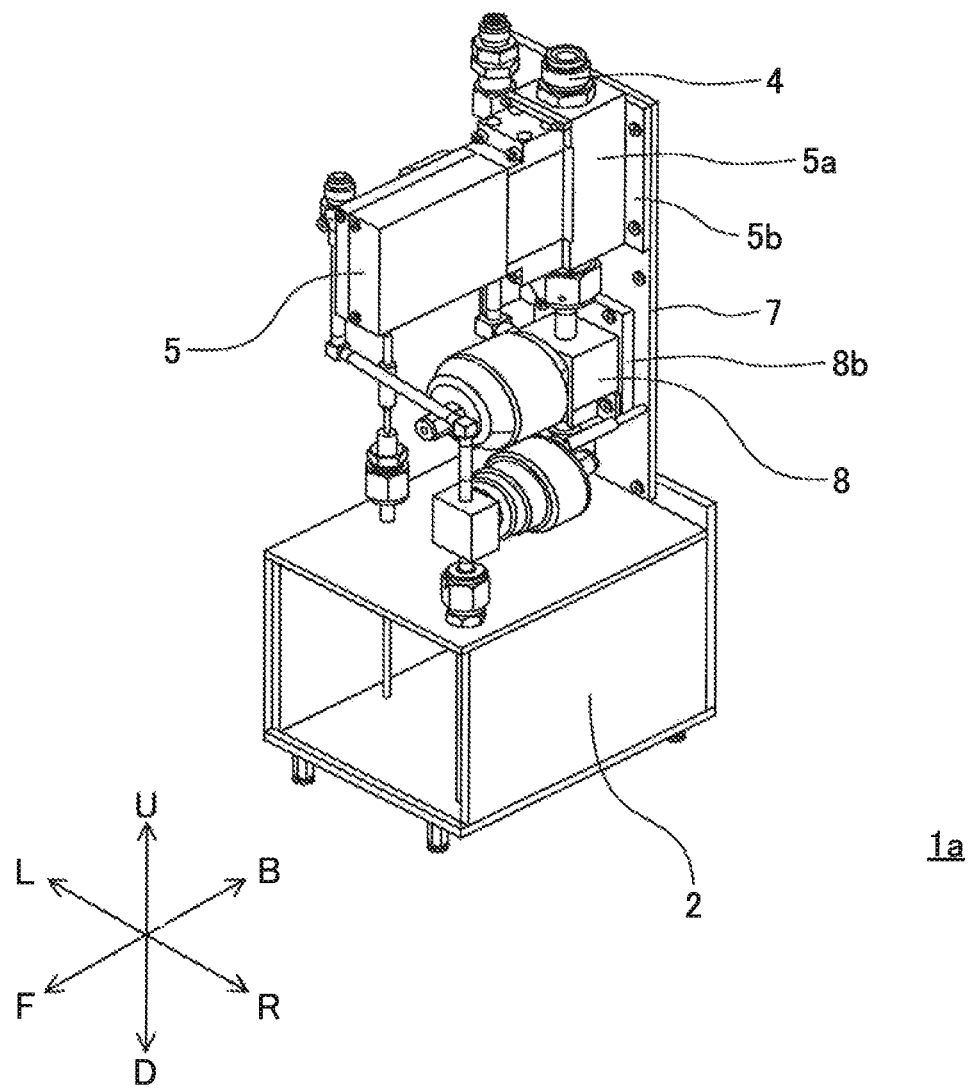
FIG. 12 is a perspective view for showing an example of the configuration of the vaporizer according to the prior art.

However, in the vaporizer 1a according to the prior art exemplified in FIG. 11 and FIG. 12, the flow rate measuring means 5 and the valve 8 are fixed to the heater plate 7 at the mounting panel 3c side opposite to the detachable panel 3b that is a removable panel of the cabinet 3. For this reason, even when the flow rate measuring means 5 and/or the valve 8 is removed from the heater plate 7 for the purpose of inspection or repair, for example, as mentioned above, it is not easy to operate a tool, such as a screwdriver, from the detachable panel 3b side to remove the flow rate measuring means 5 and the valve 8. Such an operation becomes further more difficult when a piping other than the conduit 4 for supplying the gas generated from the liquid material, etc. is add and arranged in the inside of the cabinet 3.

Moreover, the flow rate measuring means fixing base 5b and the valve fixing base 8b are respectively joined to the conduit 4 by joints, and it is necessary to use a tool, such as a spanner, to release these junctions in order to remove the flow rate measuring means 5 and the valve 8 from the heater plate 7. However, since the conduit 4 is also located in the mounting panel 3c side opposite to the detachable panel 3b, it is not easy to operate a tool, such as a spanner, in the narrow space of the cabinet 3 to release these junctions through the joints.

Due to the above-mentioned concern, space required for an operation of a tool had to be secured in the inside of the cabinet 3 in order to make it easy to mount and remove the flow rate measuring means 5 and the valve 8 in the vaporizer 1a according to the prior art. For this reason, in the vaporizer 1a according to the prior art, it was difficult to meet the demand to narrow the width of the vaporizer or to prepare a plurality of gas supply lines in the inside of the vaporizer.

The present invention has been made in view of the above-mentioned subjects, and one of its objectives is to provide a vaporizer, in which the flow rate measuring means and the valve installed in the vaporizer can be easily removed and/or installed again for the purpose of inspection or repair, etc., even when the width of the vaporizer is narrowed and/or a plurality of gas supply lines are prepared in the inside of the vaporizer.

Solution to Problem

In order to attain the above-mentioned objective, in one embodiment, the present invention relates to a configuration of a vaporizer comprising a tank, a cabinet, a conduit, a flow rate measuring means and a heater plate, wherein the cabinet comprises a detachable panel that is a panel which can be removed, and is characterized in that a first support member is fixed directly or indirectly to the cabinet at a position other than the detachable panel, the flow rate measuring means is supported by the first support member, and the heater plate is supported between the flow rate measuring means and the detachable panel by the first support member.

By adopting the above-mentioned configuration, the function to support the flow rate measuring means and the function to heat a conduit, which the heater plate combines in the vaporizer according to the prior art, are divided to the first support member and the heater plate, respectively. Thereby, the heater plate can be removed to expose the flow rate measuring means while maintaining a state where the flow rate measuring means is supported by the first support member fixed to the cabinet. And, since a fixture, such as a screw, which fixes the flow rate measuring means to the first support member, can be easily removed from the detachable panel side of the cabinet using a tool, such as a screwdriver, the flow rate measuring means can be easily removed from the vaporizer as compared with the vaporizer according to the prior art.

In another embodiment, the present invention is characterized by comprising one or more heat conducting members which conducts heat to the conduit from the heater plate. In accordance with this configuration, since heat from the heater plate can be transmitted preferentially (on a priority basis) and efficiently to the segment of the conduit, which needs to be heated, among the members constituting the vaporizer, power consumptions by the heater plate can be reduced. Moreover, the freedom of position where the conduit 4 is arranged can be raised.

According to another aspect a vaporizer includes a first support member fixed to a cabinet, and has a configuration in which a flow rate measuring means is supported by the first support member and a heater plate is supported between the flow rate measuring means and a detachable panel that is a removable panel of the cabinet by the first support member. The vaporizer further comprises one or more heat conducting members which conducts heat to a conduit from the heater plate. When it is difficult to support a valve which starts and stops supplying gas generated in a tank by the conduit, it is desirable to fix the valve to the cabinet with a member which cannot transmit heat easily. Thereby, the flow rate measuring means can be easily removed and/or installed again for the purpose of inspection or repair, even when the width of the vaporizer is narrowed and/or a plurality of gas supply lines are prepared.

Advantageous Effects

In accordance with the vaporizer according to several embodiments, operations to remove the flow rate measuring means from the first support member for inspection and/or to mount a repaired or exchanged flow rate measuring means to the first support member again can be performed easily without securing a space required for an operation of a tool in the inside of the cabinet. For this reason, the width of the vaporizer can be made narrower than before, or a plurality of gas supply lines can be prepared in the inside of the vaporizer.

DESCRIPTION OF EMBODIMENTS

Embodiments for carrying out the present invention will be explained in detail below, referring to drawings. However, the embodiments described here are only exemplifications to the last, and the embodiments for carrying out the present invention are not limited to the embodiments described here.

First Embodiment

Figure 1:
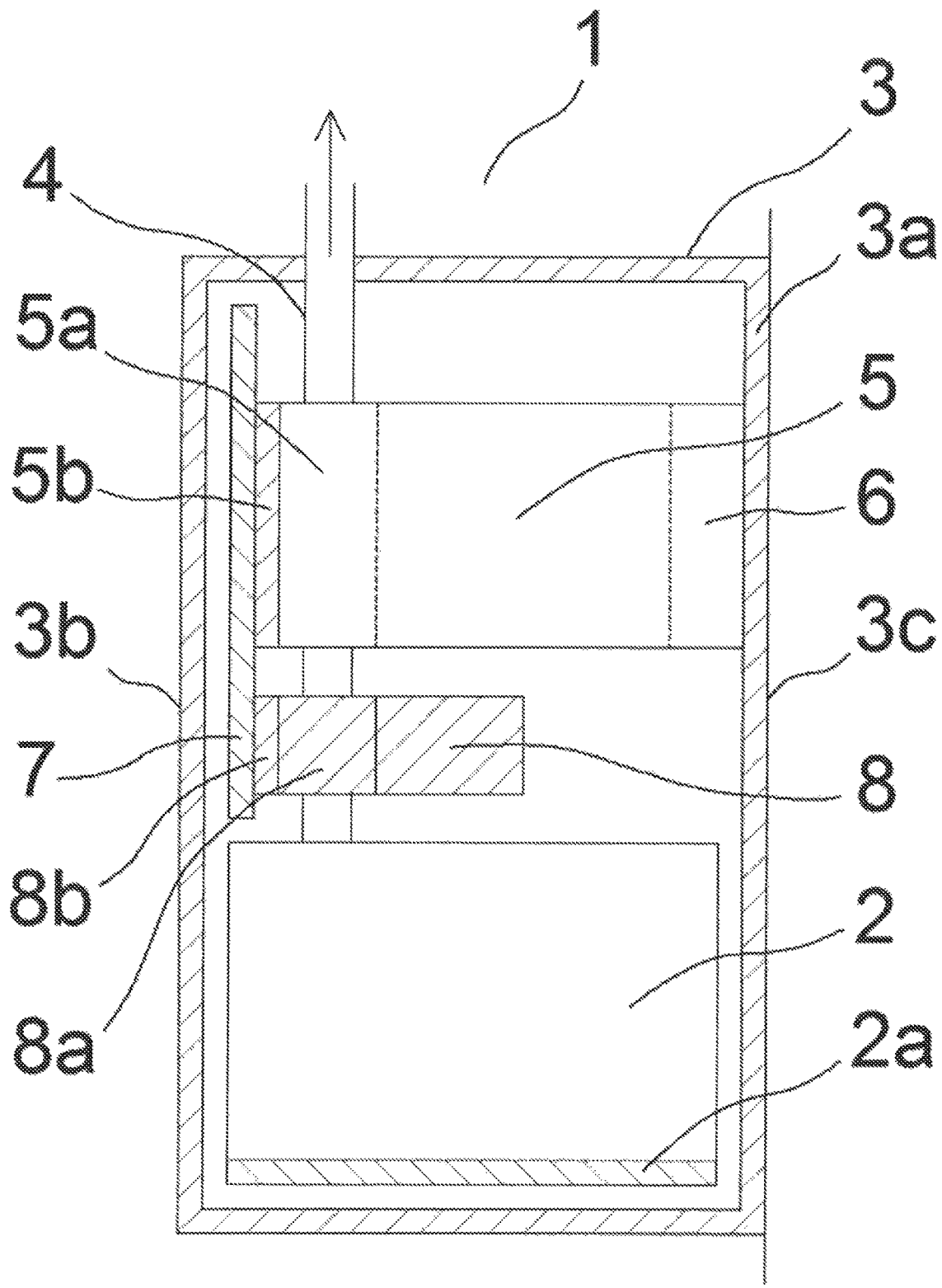
FIG. 1 is a schematic right side view for showing an example of a configuration of a vaporizer according to the present invention.

FIG. 1 is a schematic right side view for showing an example of a configuration of a vaporizer according to the present invention. A vaporizer 1 comprises a tank, 2 in which liquid material is heated to generate gas, a cabinet 3 which houses the tank 2, a conduit 4 which supplies the gas to the outside of the cabinet 3, a flow rate measuring means 5 which measures a flow rate of the gas flowing through the conduit 4, and a heater plate 7 which heats the conduit 4. The cabinet 3 comprises a detachable panel 3b that is a panel which can be removed. When the gas generated in the tank 2 is flowing through the conduit 4, the flow rate of the gas is measured by the flow rate measuring means 5, the gas flows through the conduit 4 in a direction indicated by an arrow, and is supplied to a semiconductor producing apparatus which is not shown.

The tank 2 is a container which can be sealed. Liquid material is supplied to the tank 2 through a liquid material supply pipe, which is not shown, and stored in the tank 2. The liquid material stored in the tank 2 is heated with a tank heater 2a, and is evaporated to generate gas. The generated gas stays in a space between a surface (liquid level) of the liquid material inside the tank 2 and a ceiling of the tank 2, and flows outside through the conduit 4. Purge gas can be supplied to the conduit 4 using a piping which is not shown. A level sensor which measures a position of the surface of the liquid material and a temperature sensor which measures temperature of the liquid material can be prepared in the inside of the tank 2.

The cabinet 3 is a case in which the tank 2 and other component parts constituting the vaporizer 1 are stored. The cabinet 3 fixes positions of the component parts and protects precision instruments, such as the flow rate measuring means, against a surrounding environment. The cabinet 3 can be constituted with a coated steel panel, etc., for example.

Usually, the vaporizer 1 is used in a state where the mounting panel 3c of the cabinet 3 is fixed to a wall, etc. The detachable panel 3b of the cabinet 3 is configured to be removable. By removing the detachable panel 3b, the component parts stored in the cabinet 3 can be removed for the purpose of inspection or repair and/or mounted again.

The cabinet 3 may comprise a heat Insulator 3a. The heat Insulator 3a serves to keep the temperature inside the cabinet 3 constant by preventing the heat generated with the tank heater 2a or the heater plate 7 from escaping to the outside of the cabinet 3. It is desirable that the heat Insulator 3a is disposed on the surface inside the cabinet 3 (inner wall surface) without any space. As the heat Insulator 3a, heat resistant material, such as well-known silicone rubber or ethylene propylene diene rubber, can be used.

The conduit 4 is a piping which supplies the gas generated in the tank 2 to the outside of the cabinet 3. In this specification, the conduit 4 may be one piping or may be an aggregate of a plurality of piping connecting the component parts. Material constituting the conduit 4 can be suitably chosen according to a kind of the liquid material to be used. A stainless steel pipe can be used for the conduit 4, for example. A branched piping for introducing purge gas which discharges gas inside the conduit 4 can be prepared in the conduit 4.

The flow rate measuring means 5 is a means to measure a flow rate of the gas which flows through the conduit 4. Specifically, the flow rate measuring means 5 can be constituted by a mass flow meter prepared in the middle of the conduit 4. As a mass flow meter, a well-known thermal type mass flow meter or a pressure type mass flow meter can be used, for example.

The heater plate 7 is a heating element which heats the conduit 4. The gas generated in the tank 2 has the nature of being condensed and returned to liquid when its temperature falls. In order to prevent this, the conduit 4 is heated with the heater plate 7. The heater plate 7 can be constituted by sticking a 1.5-millimeter-thick rubber heater on a 2-millimeter-thick tabular member formed of aluminum-based material which easily transmits heat, for example. The rubber heater is a member obtained by putting a resistance heating element in a shape of wire or foil between heat resistant rubbers, for example. Generally, a calorific value per square centimeter of a rubber heater is about 1 W at the maximum, and a heat resisting temperature (heatproof temperature) is about 200° C.

The vaporizer 1 according to the present invention comprises a first support member 6 fixed directly or indirectly to the cabinet 3 at a position other than the detachable panel 3b. The position where the first support member 6 is fixed to the cabinet 3 can be chosen suitably according to a shape and/or structure of the cabinet 3, etc. For example, when the front face of the cabinet 3 is constituted as the detachable panel 3b, the first support member 6 can be fixed to any of faces other than the detachable panel 3b, such as an opposing surface that is a surface opposed to the detachable panel 3b of the cabinet 3 (in this example, the mounting panel 3c), side surfaces located on the right and left sides or an upper surface located on the upper side when viewed from the front.

A well-known means, such as a screw clamp and/or welding, can be used to fix the first support member 6, for example. It is desirable to fix the first support member 6 to a member constituting the cabinet 3 (for example, a coated steel panel, etc.) rather than on the surface of the heat Insulator 3a. The first support member 6 may be fixed directly to the inside of the cabinet 3, or may be fixed indirectly to the cabinet 3 (through the tank 2) by being fixed to the outside of the tank 2 stored in the cabinet 3.

Figure 2:
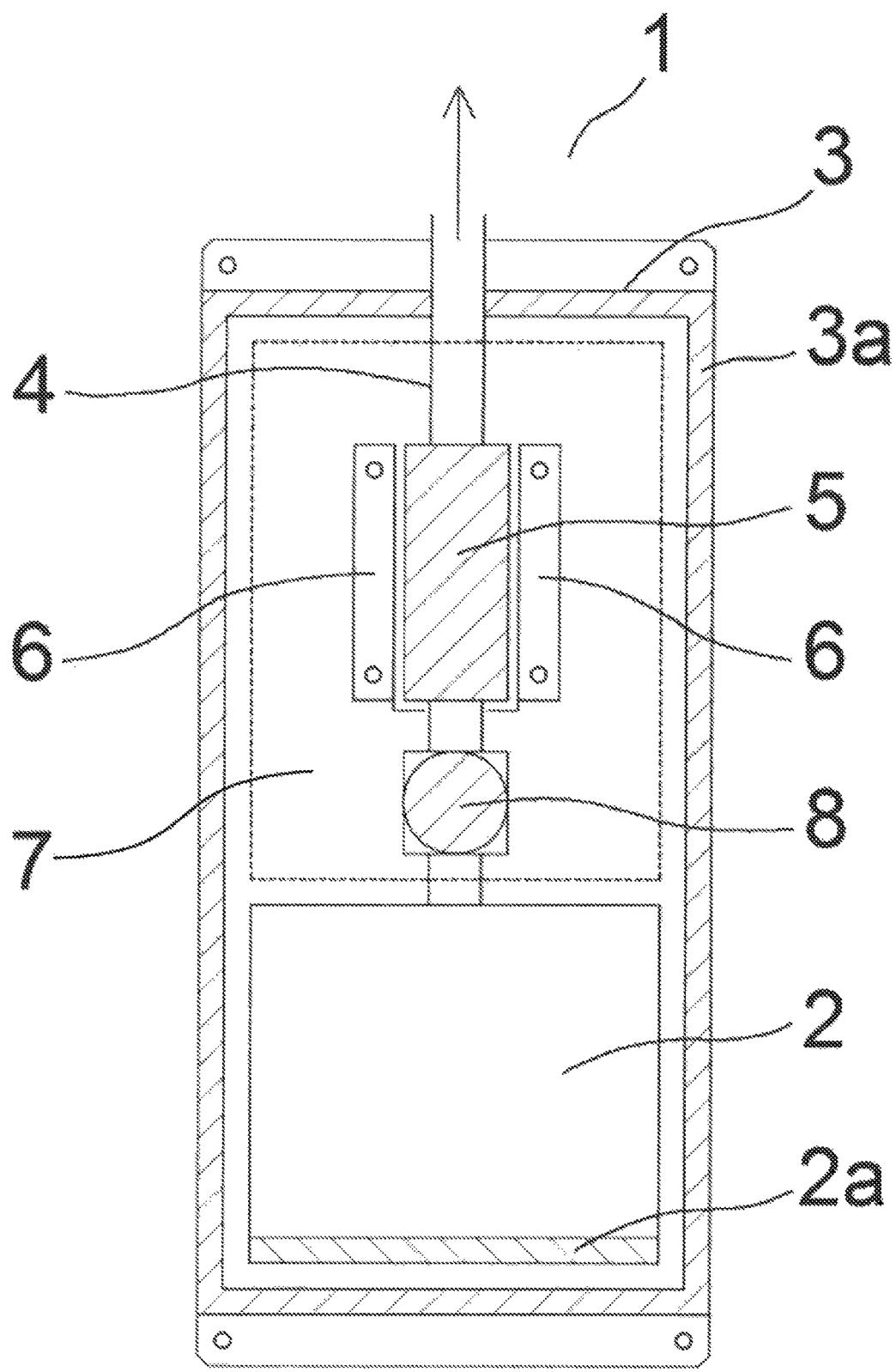
FIG. 2 is a schematic front view for showing an example of the configuration of the vaporizer according to the present invention.
Figure 3:
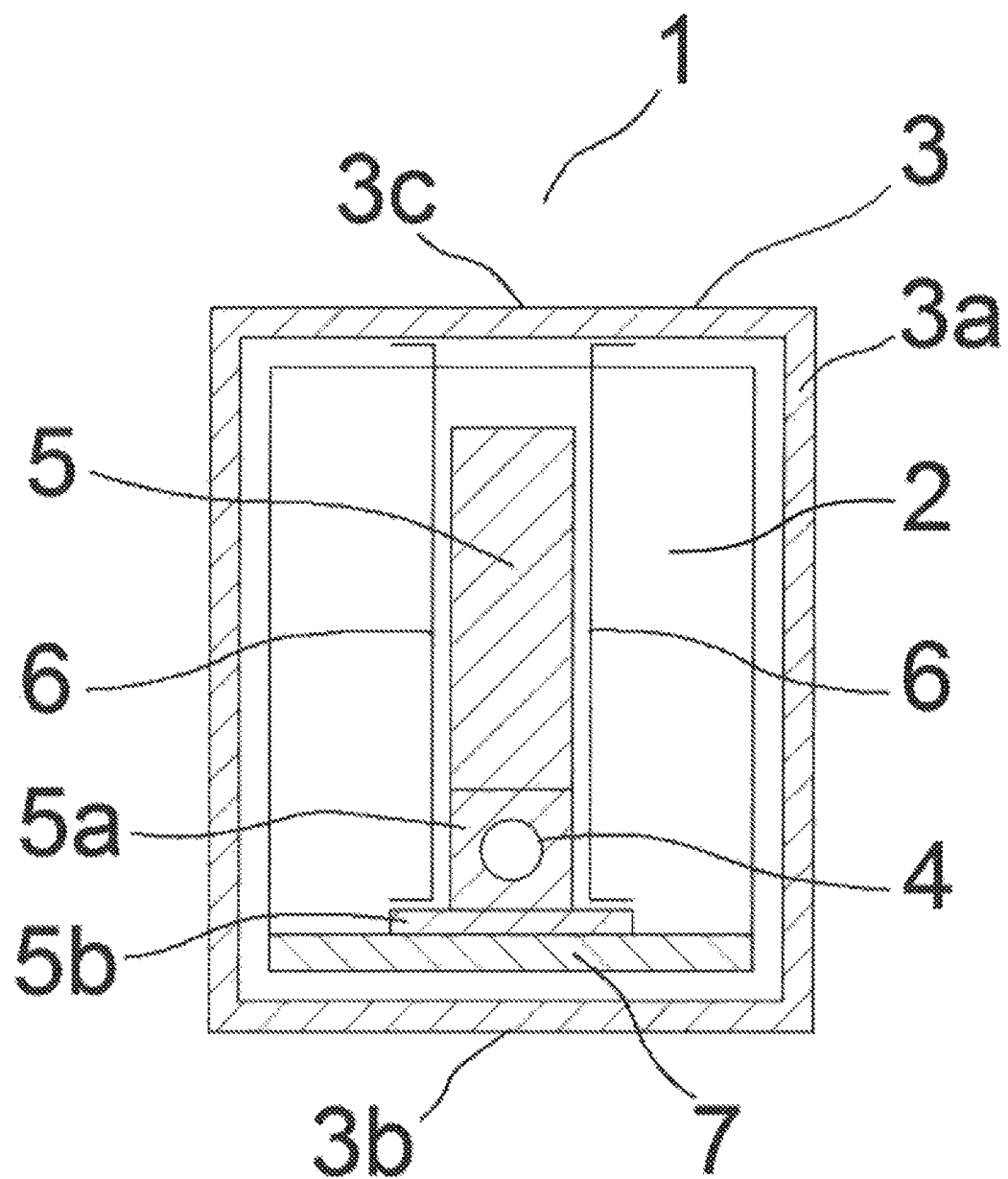
FIG. 3 is a schematic plan view for showing an example of the configuration of the vaporizer according to the present invention.

FIG. 2 is a schematic front view for showing an example of the configuration of the vaporizer according to the present invention. Moreover, FIG. 3 is a schematic plan view for showing an example of the configuration of the vaporizer according to the present invention. As exemplified in these drawings, the first support member 6 can be constituted by a pair of tabular members on the right and left sides with those end portions bent a right angle. One of the bent end portions of the first support member 6 is screwed to the mounting panel 3c of the cabinet 3. Unlike the heater plate 7, the first support member 6 does not need to have a function to transmit heat. For this reason, the first support member 6 can be constituted by a stainless steel plate excellent in mechanical strength and corrosion resistance, etc.

In the vaporizer 1 according to the present invention, the flow rate measuring means 5 is supported by the first support member 6. As shown in FIG. 2, for example, the first support member 6 can be constituted so as to clamp the flow rate measuring means 5 from the right and left sides and support the flow rate measuring means 5 with its lower end portion bent toward the flow rate measuring means 5 side to prevent the flow rate measuring means 5 from falling. The flow rate measuring means 5 can be mounted and removed by being slid forward and backward between the pair of the first support members 6 on the right and left sides. The flow rate measuring means 5 can be fixed to the first support member 6 with a detachable means such as a screw clamp, after being mounted on the first support member 6.

In the vaporizer 1 according to the present invention, the heater plate 7 is supported between the flow rate measuring means 5 and the detachable panel 3b of the cabinet 3 by the first support member 6. The end portion closer to the heater plate 7 of the first support member 6 can be bent in a crosswise direction (right-and-left direction) as shown in FIG. 3, for example. The heater plate 7 can be fixed to the bent portion of the first support member 6 with a detachable means such as a screw clamp. By supporting the heater plate 7 with the first support member 6 in this way, mechanical strength sufficient for supporting the heater plate 7 having a large area and weight can be secured.

When the heater plate 7 is fixed to the first support member 6, it is desirable to make the surface of the heater plate 7 contact closely with the surface of a segment, in which a channel of gas is prepared, of the flow rate measuring means 5 such that heat can be transmitted efficiently. On the side opposite to the side, which is in contact with the flow rate measuring means 5, of the heater plate 7, the heat Insulator 3a prepared inside the detachable panel 3b of the cabinet 3 is located. The emission of the heat generated in the heater plate 7 to the outside is hindered by the heat Insulator 3a.

In the first embodiment, when trying to remove the flow rate measuring means 5 for inspection or repair, the detachable panel 3b of the cabinet 3 is removed first, and the heater plate 7 is exposed. Next, the heater plate 7 is removed from the first support member 6, and the flow rate measuring means 5 is exposed. And, fixation of the flow rate measuring means 5 and the first support member 6 and the junction of the flow rate measuring means 5 and the conduit 4 are released using tools, such as a screwdriver and a spanner, and the flow rate measuring means 5 is slid to be removed. The flow rate measuring means 5 whose inspection or repair has been finished or a new flow rate measuring means 5 for replacement can be mounted on the vaporizer 1 according to a procedure contrary to the above-mentioned procedure.

The flow rate measuring means 5 can be mounted on and removed from the vaporizer 1 in a space opened wide after removing the detachable panel 3b of the cabinet 3. Moreover, since both portions where the first support member 6 is fixed with the heater plate 7 and the first support member 6 is fixed with the flow rate measuring means 5 are exposed to the detachable panel 3b side, a tool, such as a screwdriver, can reach easily. Therefore, as compared with the vaporizer 1a according to the prior art, the flow rate measuring means 5 can be mounted and removed more easily.

Modification 1-1

In one preferable modification 1-1 of the first embodiment of the present invention, it is desirable that a junction of the flow rate measuring means 5 and the conduit 4 is arranged at a position closer to the detachable panel 3b than to an opposing surface that is a surface opposed to the detachable panel 3b of the cabinet 3 in the flow rate measuring means 5 as exemplified in FIG. 3. In other words, it is desirable that at least the junction of the flow rate measuring means 5 and the conduit 4 is arranged at a position closer to the detachable panel 3b than an opposing surface that is a surface opposed to the detachable panel 3b of the cabinet 3 (in this example, the mounting panel 3c). In this case, since the junction of the flow rate measuring means 5 and the conduit 4 is exposed to the detachable panel 3b side of the cabinet 3, a tool, such as a spanner, can reach easily. Therefore, as compared with the vaporizer 1a according to the prior art wherein the junction is located on the opposite side of the detachable panel 3b, the flow rate measuring means 5 can be mounted and removed more easily.

In the modification 1-1, the flow rate measuring means 5 can be mounted and removed easily in a widely opened space in front of the detachable panel 3b of the cabinet 3. Therefore, it is not necessary to prepare a space required for an operation of a tool in the inside of the cabinet 3. For this reason, the width of the vaporizer 1 can be made narrower than before. Although the width of the vaporizer 1 which can be attained by the present invention differs depending on the capacity of the tank and other conditions, it is about 60 to 70 millimeters typically.

Moreover, also in the modification 1-1, when the heater plate 7 is fixed to the first support member 6, it is desirable to make the surface of the heater plate 7 closely contact with the surface of a segment, in which a channel of gas is prepared, of the flow rate measuring means 5 such that heat can be transmitted efficiently. Thereby, since the heat generated by the heater plate 7 is transmitted efficiently to the segment, in which a channel of gas is prepared, of the flow rate measuring means 5, condensation of the gas in the channel prepared in the flow rate measuring means 5 can be prevented more certainly.

Modification 1-2

In another preferable modification 1-2 of the first embodiment of the present invention, the vaporizer 1 according to the present invention comprises a flow rate measuring means fixing base 5b between the flow rate measuring means 5 and the heater plate 7, and the flow rate measuring means 5 is supported through the flow rate measuring means fixing base 5b by the first support member 6. As exemplified in FIG. 1 and FIG. 3, the flow rate measuring means fixing base 5b can be constituted by a tabular member which has almost the same shape as the surface of the flow rate measuring means 5 and is opposed to the detachable panel 3b of the cabinet 3. It is desirable that the flow rate measuring means fixing base 5b is constituted by a tabular member formed of aluminum-based material which easily transmits heat, like the heater plate 7. The thickness of the flow rate measuring means fixing base 5b can be 5 millimeters, for example.

In the modification 1-2, the flow rate measuring means 5 is indirectly supported through the flow rate measuring means fixing base 5b by the first support member 6 rather than be directly supported by the first support member 6. In accordance with this configuration, since a fixing means of the flow rate measuring means 5 and the first support member 6 can be prepared in the flow rate measuring means fixing base 5b, it becomes unnecessary to prepare a new fixing means for fixing the flow rate measuring means 5 to the first support member 6 in the flow rate measuring means 5. Therefore, a general-purpose flow rate measuring means 5 used also for intended uses other than a vaporizer can be diverted to the vaporizer 1 as it is.

Also in the vaporizer 1 according to the modification 1-2, the heater plate 7 is supported between the flow rate measuring means 5 and the detachable panel 3b of the cabinet 3 by the first support member 6. The end portion closer to the heater plate 7 of the first support member 6 can be bent in a crosswise direction (right-and-left direction) as shown in FIG. 3, for example. The heater plate 7 can be fixed to the bent portion of the first support member 6 with a detachable means such as a screw clamp. Alternatively, the heater plate 7 may be fixed to the first support member 6 by sandwiching the flow rate measuring means fixing base 5b between the heater plate 7 and the bent portion of the first support member 6 and co-fastening them with a common screw or bolt, etc. Anyway, by supporting the heater plate 7 with the first support member 6 in this way, mechanical strength sufficient for supporting the heater plate 7 having a large area and weight can be secured.

As exemplified in FIG. 1 and FIG. 3, it is desirable to make the surface of the heater plate 7 contact closely with the surface of the flow rate measuring means fixing base 5b and to make the surface of the flow rate measuring means fixing base 5b contact closely with the surface of a segment, in which a channel of gas is prepared, of the flow rate measuring means 5, respectively. In this case, since the heat generated by the heater plate 7 is efficiently and intensively transmitted to the flow rate measuring means 5 through the flow rate measuring means fixing base 5b which has the same shape as the flow rate measuring means 5, condensation of the gas in the channel prepared in the flow rate measuring means 5 can be prevented more certainly.

Modification 1-3

In further another preferable modification 1-3 of the first embodiment of the present invention, the vaporizer according to the present invention comprises a flow rate measuring means joint block 5a between the flow rate measuring means 5 and the flow rate measuring means fixing base 5b, and the conduit 4 is joined with the flow rate measuring means joint block 5a. As exemplified in FIG. 1 and FIG. 3, the flow rate measuring means joint block 5a can be constituted by a block member which has a joint with the conduit 4 used as an inlet passage and an outlet passage of gas (not shown) and a junction joined airtightly to an inlet port and an outlet port of gas prepared in the bottom of the flow rate measuring means 5 (not shown). Material constituting the flow rate measuring means joint block 5a can be suitably chosen according to a kind of the liquid material to be used, like the conduit 4. Stainless steel can be used for the flow rate measuring means joint block 5a, for example.

In the modification 1-3, the joint with the conduit 4 used as the inlet passage and the outlet passage of gas is prepared in the flow rate measuring means joint block 5a attached to the flow rate measuring means 5 rather than be prepared in the flow rate measuring means 5. In accordance with this configuration, it becomes unnecessary to prepare a joint with the conduit 4, which has a diameter suitable for the vaporizer, in the flow rate measuring means 5. Therefore, a general-purpose flow rate measuring means 5 used also for intended uses other than a vaporizer can be diverted to the vaporizer 1 as it is.

Second Embodiment

In the second embodiment of the present invention, the vaporizer according to the present invention comprises a valve 8 which is disposed between the tank 2 and the flow rate measuring means 5 to start and stop supply of the gas. Supply of gas begins when the valve 8 is opened, and supply of gas stops when the valve 8 is closed. In accordance with this configuration, a suitable quantity of gas can be supplied to a semiconductor producing apparatus at a suitable timing. Moreover, gas can be prevented from stagnating in the inside of the flow rate measuring means 5 by arranging the flow rate measuring means 5 on the downstream side of the valve 8 in this way. Furthermore, depending on the configuration of the conduit 4, the inside of the flow rate measuring means 5 can be purged (discharged) with nitrogen gas, etc., in a state where the valve 8 is closed. In addition, from a viewpoint of increasing a flow rate of gas, it is desirable that a diaphragm valve which has a large cross section when opened and is operated by air pressure is used as the valve 8.

In the second embodiment, since the valve 8 is a small member as compared with the flow rate measuring means 5, the valve 8 can be supported by joining with the conduit 4. Therefore, necessity to prepare a support means like the first support member 6 which supports the flow rate measuring means 5 for the valve 8 is not necessarily high. However, in order to prevent condensation of the gas flowing through the inside of the valve 8, it is desirable to transmit heat from the heater plate 7 to the valve 8 and thereby heat the valve 8, too. Therefore, it is desirable that the surface of the valve 8 opposed to the detachable panel 3b of the cabinet 3 is in close contact with the surface of the heater plate 7 and is fixed detachably.

Modification 2-1

In one preferable modification 2-1 of the second embodiment of the present invention, the vaporizer according to the present invention comprises a valve fixing base 8b between the valve 8 and the heater plate 7, and the valve 8 is fixed to the heater plate 7 through the valve fixing base 8b. As exemplified in FIG. 1 and FIG. 3, the valve fixing base 8b can be constituted by a tabular member which has almost the same shape as the surface of the valve 8, which is opposed to the detachable panel 3b of the cabinet 3. It is desirable that the valve fixing base 8b is constituted by a tabular member formed of aluminum-based material. The thickness of the valve fixing base 8b can be 5 millimeters, for example.

In the modification 2-1, the valve 8 is not fixed directly to the heater plate 7, but is being fixed indirectly to the heater plate 7 through the valve fixing base 8b. In accordance with this configuration, since a fixing means of the valve 8 and the heater plate 7 can be prepared in the valve fixing base 8b, it becomes unnecessary to prepare a new fixing means for fixing the valve 8 to the heater plate 7 in the valve 8. Therefore, a general-purpose valve 8 used also for intended uses other than a vaporizer can be diverted to the vaporizer 1 as it is.

As exemplified in FIG. 1 and FIG. 3, it is desirable to it is desirable to make the surface of the heater plate 7 contact closely with the surface of the valve fixing base 8b and to make the surface of the valve fixing base 8b contact closely with the surface of the valve 8, respectively. In this case, since the heat generated in the heater plate 7 is efficiently and intensively transmitted to the valve 8 through the valve fixing base 8b which has the same shape as the valve 8, condensation of the gas in the valve 8 can be prevented more certainly.

Modification 2-2

In another desirable modification 2-2 of the embodiment of the second of a present invention, the vaporizer according to the present invention comprises a valve joint block 8a between the valve 8 and the valve fixing base 8b, and the conduit 4 is joined with the valve joint block 8a. As exemplified in FIG. 1 and FIG. 3, the valve joint block 8a can be constituted by a block member which has a joint with the conduit 4 used as an inlet passage and an outlet passage of gas (not shown) and a junction joined airtightly with an inlet port and an outlet port of gas prepared in the bottom of the valve 8 (not shown). Material constituting the valve joint block 8a can be suitably chosen according to a kind of the liquid material to be used, like the conduit 4. It is desirable to constitute the valve joint block 8a by material having high corrosion resistance, such as stainless steel, such that the valve joint block 8 is not corroded by the gas flowing through its inside, for example.

In the modification 2-2, the joint with the conduit 4 used as the inlet passage and the outlet passage of gas is prepared in the valve joint block 8a attached to the valve 8 rather than be prepared in the valve 8. In accordance with this configuration, it becomes unnecessary to prepare a joint with the conduit 4, which has a diameter suitable for the vaporizer, in the valve 8. Therefore, a general-purpose valve 8 used also for intended uses other than a vaporizer can be diverted to the vaporizer 1 as it is.

In the vaporizer 1 which has a configuration of the above-mentioned second embodiment, when trying to remove the valve 8 for inspection or repair, the detachable panel 3b of the cabinet 3 is removed first, and the heater plate 7 is exposed. Next, fixation of the heater plate 7 and the first support member 6 and fixation of the heater plate 7 and the valve 8 are released respectively, the heater plate 7 is removed, and the valve 8 is exposed.

Moreover, in the vaporizer 1 which has a configuration of the modification 2-1 and the modification 2-2, when the valve 8 is fixed to the heater plate 7 through the valve fixing base 8b, fixation of the heater plate 7 and the first support member 6 and fixation of the heater plate 7 and the valve fixing base 8b are released respectively, the heater plate 7 is removed, and the valve fixing base 8b is exposed. Thereafter, fixation of the valve fixing base 8b and the valve 8 is released, the valve fixing base 8b is removed, and the valve 8 is exposed.

And, the joint joining the valve 8 and the conduit 4 is released with a tool, such as a spanner, and the valve 8 is removed. When the valve 8 is joined with the conduit 4 through the valve joint block 8a, the joint joining the valve joint block 8a and the conduit 4 with a spanner, and the valve joint block 8a and the valve 8 are removed. The valve 8 whose inspection or repair has been finished or a new valve 8 for replacement can be mounted on the vaporizer 1 according to a procedure contrary to the above-mentioned procedure.

It is desirable that a junction of the valve 8 and the conduit 4 is located at a position closer to the detachable panel 3b of the cabinet 3 as exemplified in FIG. 3. In other words, it is desirable that at least the junction of the valve 8 and the conduit 4 is arranged at a position closer to the detachable panel 3b than an opposing surface that is a surface opposed to the detachable panel 3b of the cabinet 3 (in this example, the mounting panel 3c). In this case, since the joint joining the valve 8 and the conduit 4 is exposed to the detachable panel 3b side of the cabinet 3, a tool, such as a spanner, can reach easily. Therefore, as compared with the vaporizer 1a according to the prior art wherein the junction is located on the opposite side of the detachable panel 3b, the valve 8 can be mounted and removed more easily.

In addition, FIG. 1 to FIG. 3 are drawings for schematically showing an example of the configuration of the vaporizer 1 according to the present invention equivalent to the above-mentioned modification 2-2. Therefore, the flow rate measuring means joint block 5a, the flow rate measuring means fixing base 5b, the valve joint block 8a, and the valve fixing base 8b are illustrated as component parts of the vaporizer 1 in FIG. 1 to FIG. 3. However, these component parts are not component parts indispensable for the vaporizer according to the present invention.

Modification 2-3

In further another preferable modification 2-3 of the second embodiment of the present invention, the vaporizer according to the present invention comprises the valve 8, and a plurality of sets of gas supply lines comprising one conduit 4, one flow rate measuring means 5 and one first support member 6 are prepared in the inside of the cabinet 3. One valve 8 may be interposed in each of these sets of gas supply lines, or one common valve 8 may be interposed on the upstream side of a manifold branched to respective one of these sets of gas supply lines. In accordance with this modification 2-3, one vaporizer 1 is used to supply gas generated in a single tank to a plurality of semiconductor producing apparatuses or to a plurality of gas inlet points of single semiconductor producing apparatus through a plurality of gas supply lines. Therefore, the number of vaporizers required for semiconductor producing apparatuses can be reduced as compared with the prior art.

In the vaporizer 1 according to the modification 2-3, the flow rate measuring means 5 can be mounted and removed easily in a widely opened space in front of the detachable panel 3b of the cabinet 3. Therefore, it is not necessary to prepare a space required for an operation of a tool in the inside of the cabinet 3. For this reason, a plurality of sets of gas supply lines can be prepared in the inside of one vaporizer 1, without spoiling operability in mounting and removing the flow rate measuring means 5.

Modification 2-4

By the way, in order to prevent excessive pressure loss at a flow rate required for the gas generated in the tank 2, for example, the valve 8 needs to have a capacity according to the flow rate required for the gas. Especially when a plurality of sets of gas supply lines are prepared in the inside of one vaporizer 1 as mentioned above, since the flow rate of the gas supplied to a plurality of sets of the gas supply lines through the valve 8 from the tank 2 is high, it is necessary to prepare the valve 8 which has a larger capacity. Since the size and mass of the valve 8 also increase when the capacity of the valve 8 is thus increased, it may become difficult to support the valve 8 by the junction with the conduit 4. Moreover, it is also difficult to support the valve 8 by making the valve 8 contact closely with the heater plate 7.

Then, it can be considered that the valve 8 is fixed to the panel which constitutes the cabinet 3, etc. However, when the valve 8 is fixed directly to the cabinet 3 or indirectly to the cabinet 3 through the valve fixing base 8b, the heat transmitted to the valve 8 from the heater plate 7 is transmitted to the outside of the cabinet 3, and is emitted to the outside of the cabinet 3. As a result, there is a possibility that it may become difficult to sufficiently heat the valve 8 with the heat from the heater plate 7 to prevent condensation of the gas in the valve 8.

Moreover, it can be considered that the valve 8 is supported by a support member fixed at some position of the cabinet 3 like the above-mentioned flow rate measuring means 5. However, such a support member can become a heat dissipation route to transmit the heat transmitted to the valve 8 from the heater plate 7 to the cabinet 3 to release the heat to the outside of the cabinet 3. From a viewpoint of more certainly preventing condensation of the gas in the valve 8, it is desirable that the quantity of heat carried to the cabinet 3 from the valve 8 through the support member which supports the valve 8 is smaller than the quantity of heat carried to the valve 8 from the heater plate 7.

Then, in further another preferable modification 2-4 of the second embodiment of the present invention, the vaporizer according to the present invention comprises a second support member 8c fixed directly or indirectly to the cabinet 3 at a position other than the detachable panel 3b. Furthermore, the valve 8 is supported directly or indirectly by the second support member 8c. In addition, the second support member 8c is configured such that the quantity of heat transferred to the cabinet 3 from the valve 8 through the second support member 8c is smaller than the quantity of heat transferred to the valve 8 from the heater plate 7.

In accordance with the modification 2-4, even when it is difficult to support the valve 8 by the junction with the conduit 4 since the capacity of the valve 8 is large, the valve 8 can be certainly supported with the second support member 8c. Moreover, since the quantity of heat carried to the cabinet 3 through the second support member 8c from the valve 8 as mentioned above is smaller than the quantity of heat carried to the valve 8 through the valve fixing base 8b from the heater plate 7, the emission of the heat transmitted to the valve 8 from the heater plate 7 to the outside of the cabinet 3 can be suppressed. As a result, condensation of the gas in the valve 8 can be prevented effectively.

Modification 2-5

A configuration of the second support member 8c is not limited in particular as long as the requirements explained in the modification 2-4 are satisfied. For example, the above-mentioned requirements can be satisfied by constituting the second support member 8c by material which has a smaller thermal conductivity, and/or by making smaller the cross section of the second support member 8c as a route through which heat is transmitted (heat flow path).

Then, in the vaporizer according to further another preferable modification 2-5 of the second embodiment of the present invention, the second support member 8c is constituted by material which has a thermal conductivity smaller than a thermal conductivity of material constituting the valve fixing base 8b, and/or the second support member 8c is configured such that the minimum value of the cross section of a heat flow path through the second support member 8c is smaller than the minimum value of the cross section of a heat flow path through the valve fixing base 8b.

For example, when the valve fixing base 8b is constituted by the aluminum-based material as exemplified in the modification 2-1, the second support member 8c can be constituted by material which has a thermal conductivity smaller than that of the aluminum-based material, such as stainless steel plate, etc. Moreover, when the valve fixing base 8b is constituted by a tabular member which has almost the same shape as the surface of the valve 8, which is opposed to the detachable panel 3b of the cabinet 3 as exemplified in the modification 2-1, the second support member 8c can be constituted by a member which has a cross section smaller than the area of a principal surface of the tabular member (cross section of heat flow path) as long as it is possible to support the valve 8.

In accordance with the modification 2-5, the valve 8 which has a large capacity can be supported certainly, while more certainly suppressing the emission of the heat transmitted to the valve 8 from and the heater plate 7 to the outside of the cabinet 3 to preventing condensation of the gas in the valve 8 more certainly.

Modification 2-6

By the way, even in a case where the quantity of heat carried to the cabinet 3 from the valve 8 through the support member which supports the valve 8 is smaller than the quantity of heat carried to the valve 8 from the heater plate 7 by the configuration as exemplified in the above-mentioned modification 2-4 and modification 2-5, there is a possibility that a part of heat to be transmitted to the valve 8 from the heater plate 7 may be emitted to the outside of the cabinet 3 through the second support member 8c.

For example, when the valve 8 is supported by fixing the second support member 8c to the end surface of the valve fixing base 8b on the opposite side of the valve 8, a part of heat transmitted to the valve fixing base 8b from the heater plate 7 is transmitted to the second support member 8c to be emitted to the outside of the cabinet 3 without reaching the end surface of the valve fixing base 8b on the valve 8 side. Therefore, in order to secure more quantity of heat transmitted to the valve 8 from the heater plate 7, it is desirable to fix the second support member 8c as close to the valve 8 as possible.

Then, in the vaporizer according to further another preferable modification 2-6 of the second embodiment of the present invention, the second support member 8c is configured to support the valve 8 at an end surface of the valve fixing base 8b on the valve 8 side or at a position closer to the valve 8 than the end surface.

Figure 4:
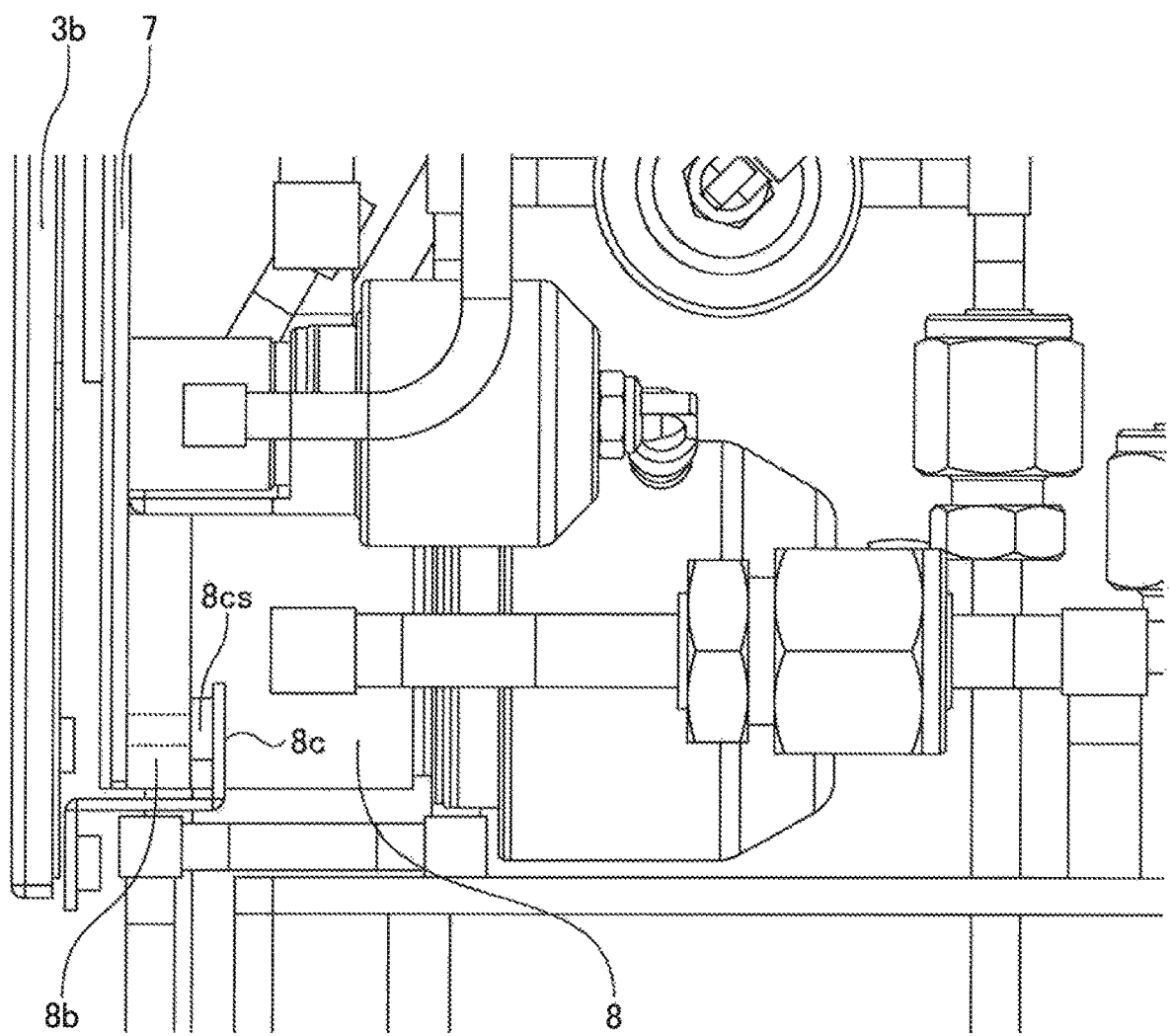
FIG. 4 is a right side view for showing an example of a configuration in the vicinity of a valve which the vaporizer according to the present invention comprises.

For example, FIG. 4 is a right side view for showing an example of a configuration in the vicinity of a valve 8 which the vaporizer 1 according to the modification 2-6 comprises. In this example, one end of the second support member 8c is fixed to the detachable panel 3b of the cabinet 3 in a detachable manner, the other end of the second support member 8c is fixed to the surface of the valve fixing base 8b on the valve 8 side in a detachable manner, and thereby the valve 8 is supported. The second support member 8c is a mount plate constituted by a stainless steel plate which has a thermal conductivity lower than the thermal conductivity of the aluminum-based material which constitutes the valve fixing base 8b, and the cross section of the heat flow path in the second support member 8c is smaller than the cross section of the heat flow path in the valve fixing base 8b. Furthermore, a spacer 8cs made from stainless steel and having a small outside diameter is interposed between the second support member 8c and the valve fixing base 8b. Thereby, as compared with a case where the second support member 8c is fixed directly to the valve fixing base 8b (not through the spacer 8cs), the cross section of the heat flow path between the second support member 8c and the valve fixing base 8b can be made smaller.

In accordance with the modification 2-6 which has the configuration as mentioned above, the quantity of heat carried to the cabinet 3 from the valve 8 through the support member which supports the valve 8 can be made smaller than the quantity of heat carried to the valve 8 from the heater plate 7. As a result, the valve 8 which has a large capacity can be supported certainly, while further more certainly reducing the proportion of the heat emitted to the outside of the cabinet 3 to the heat transmitted to the valve 8 from the heater plate 7 to prevent condensation of the gas in the valve 8 further more certainly.

In addition, when the support member which supports the valve 8 is fixed to the detachable panel 3b of the cabinet 3, there is a possibility that it may become difficult to easily remove the detachable panel 3b. Therefore, it is more desirable that the support member which supports the valve 8 is fixed to a position other than the detachable panel 3b of the cabinet 3.

Third Embodiment

In the third embodiment of the present invention, the vaporizer 1 comprises one or more heat conducting members which conducts heat to the conduit 4 from the heater plate 7. Depending on a layout of the component parts inside the vaporizer 1, for example, for the purpose of avoiding interference of component parts, etc., the conduit 4 longer than the shortest distance may have to be prepared. In such a case, a possibility that the temperature of the gas passing through the conduit 4 may fall and the gas may be condensed increases. By preparing one or more heat conducting members which conduct heat to the conduit 4 from the heater plate 7, the heat of the heater plate 7 can be transmitted to the conduit 4 to prevent drop in the temperature of gas even when the conduit 4 is long.

The heat conducting member can be constituted by aluminum-based material which easily transmits heat. The shape of the heat conducting member can be made into a shape obtained by bending a 2-millimeter-thick plate into a shape of L character, for example. The heat of the heater plate 7 can be transmitted to the conduit 4 by making one surface of the L character shape contact with the surface of the heater plate 7 and making the other surface of the L character shape contact with the conduit 4. In this case, since the heat conducting member is in line contact with the conduit, it is desirable to increase the contact area of the heat conducting member and the conduit 4 by winding aluminum foil around the both the heat conducting member and the conduit 4, etc., for example.

In accordance with the vaporizer 1 according to the third embodiment, heat can be transmitted preferentially (on a priority basis) and efficiently to the segment of the conduit, which needs to be heated, among the members constituting the vaporizer 1. Therefore, since the freedom of position where the conduit 4 is arranged can be raised, it becomes easier to narrow the width of the vaporizer 1 or to install a plurality of gas supply lines in the inside of the vaporizer 1. Moreover, as compared with a vaporizer according to the prior art, which heats the whole inside of the cabinet 3 to uniform temperature, the power consumptions by the heater plate 7 can be reduced.

Modification 3-1

As mentioned above, in the third embodiment of the present invention, the vaporizer 1 comprises one or more heat conducting members which transmits heat to the conduit 4 from the heater plate 7. Thereby, the heat of the heater plate 7 can be transmitted effectively to the conduit 4 to prevent drop in the temperature of gas even when the long conduit 4 is prepared for the purpose of avoiding interference of component parts, etc., for example.

However, depending on the configuration of the vaporizer 1, the conduit 4 may have complicated structure entangling each other, such as a piping structure for the purge gas for purging (discharging) the gas of the liquid material in a narrow cabinet (for example, a manifold, etc.), for example. Especially, when a plurality of sets of gas supply lines are prepared in the inside of the cabinet like the above-mentioned modification 2-3, the conduit 4 may have further more complicated structure.

In a case as mentioned above, when the heat conducting member is fixed in contact with the conduit 4, there is a possibility that it may become difficult to remove the flow rate measuring means 5 and/or the valve 8 from the vaporizer 1 Moreover, it is difficult to manufacture the heat conducting member which has a shape corresponding accurately to the complicated structure of the conduit 4 and assemble the heat conducting member in an accurate alignment, there is also a possibility that it may lead to problems, such as increase in manufacturing cost and/or decrease in manufacturing efficiency of the vaporizer 1.

Then, in the vaporizer according to one preferable modification 3-1 of the third embodiment of the present invention, the heat conducting member is configured such that end portions further from the heater plate 7 of the heat conducting members are in direct contact with neither the conduit 4 nor members in direct contact with the conduit 4 and heat is conducted to the conduit 4 from the heater plate 7 by radiation from the end portions.

Figure 5:
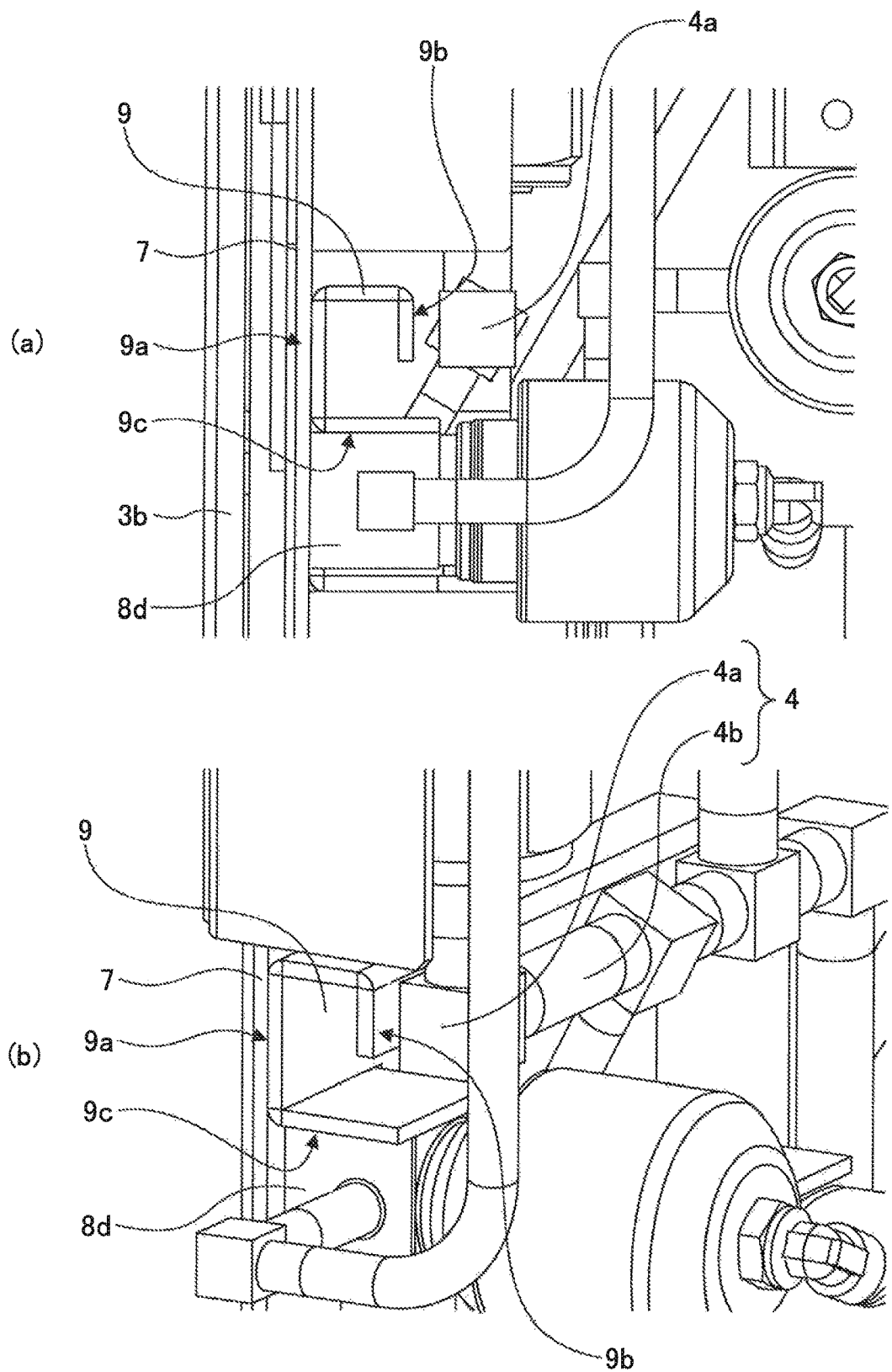
FIG. 5 includes (a) a right side view and (b) a perspective view for showing an example of a configuration of a heat conducting member incorporated in the vaporizer according to the present invention.

For example, FIG. 5 includes (a) a right side view and (b) a perspective view for showing an example of a configuration of a heat conducting member 9 incorporated in the vaporizer 1 according to the modification 3-1. In this example, one outer surface 9a (end portion closer to the heater plate 7) of the heat conducting member 9 which has an approximately C-character shaped variant cross section and is formed of aluminum-based material is in contact closely with the heater plate 7. On the other hand, other outer surface 9b (end portion further from the heater plate 7) opposed to the above-mentioned outer surface is opposed a predetermined distance apart to one outer surface of the joint blocks 4a interposed in a bent portion of the conduit 4 which supplies the gas of liquid material to the flow rate measuring means 5 (specifically, one of two mass flow controllers which the vaporizer 1 comprises). Namely, the outer surface 9b is in direct contact with neither the conduit 4 nor members (the joint block 4a, etc.) in direct contact with the conduit 4.

The above-mentioned "predetermined distance" is properly set such that the conduit 4 can be sufficiently heated by conducting the heat transmitted to the heat conducting member 9 from the heater plate 7 through radiation to the opposing outer surface of the joint block 4a from the outer surface 9b to heat the joint block 4a. Namely, the heat conducting member 9 is configured to conduct heat to the conduit 4 from the heater plate 7 by radiation from the end portions further from the heater plate 7 (outer surface 9b).

In accordance with the modification 3-1 which has the configuration as mentioned above, the heat of the heater plate 7 can be transmitted effectively to the conduit 4 to prevent drop in the temperature of the gas even in a case where the conduit 4 has complicated structure entangling each other, such as a case where a plurality of sets of gas supply lines are prepared in the interior of the cabinet 3, for example. Therefore, since the freedom of position where the conduit 4 is arranged can be raised, it becomes easier to narrow the width of the vaporizer 1 or to install a plurality of gas supply lines in the inside of the vaporizer 1.

In addition, in accordance with the modification 3-1, since the heat conducting member 9 is not fixed in a state of being in contact with the conduit 4, the possibility that it may become difficult to remove the flow rate measuring means 5 and/or the valve 8 from the vaporizer 1 can be reduced. Moreover, it is not necessary to manufacture a heat conducting member which has a shape corresponding accurately to the complicated structure of the conduit 4 and assemble the heat conducting member in an accurate alignment, problems, such as increase in manufacturing cost and/or decrease in manufacturing efficiency of the vaporizer 1, can be reduced, for example.

In addition, as shown in FIG. 5, the heat conducting member 9 in this example is a member which has an approximately C-character shaped variant cross section and is formed of aluminum-based material, and in contact with the side surface of the joint block 8d of the valve which contacts closely with the heater plate 7. Namely, the heat conducting member 9 in this example functions also as a heat conducting member which transmits heat to the valve from the heater plate 7. Thus, the vaporizer 1 according to the present invention may further comprise a heat conducting member which transmits heat to the valve from the heater plate 7, or both the function to transmit heat to the conduit 4 from the heater plate 7 and the function to transmit heat to the valve from the heater plate 7 may be attained by one heat conducting member.

Modification 3-2

In the modification 3-1, the heat conducting member 9 is configured such that the end portions further from the heater plate 7 of the heat conducting member 9 are in direct contact with neither the conduit 4 nor members in direct contact with the conduit 4 and heat is conducted to the conduit 4 from the heater plate 7 by radiation from the end portions. However, from a viewpoint of attaining efficient heat transfer from the heater plate 7 to the conduit 4, it is desirable that the heat conducting member 9 is in contact with both the heater plate 7 and the conduit 4.

Then, in the vaporizer 1 according to another preferable modification 3-2 of the third embodiment of the present invention, the heat conducting member 9 is configured to be in contact with both of the conduit 4 and said heater plate 7.

In the vaporizer 1 according to the modification 3-2, the heat conducting member 9 is configured to contact with both the conduit 4 and the heater plate 7 as mentioned above. Therefore, heat can be more certainly transmitted to the segment of the conduit 4, which needs to be heated, among the members constituting the vaporizer 1.

Modification 3-3

In the modification 3-2, the heat conducting member 9 is configured to contact with both the conduit 4 and the heater plate 7 as mentioned above. However, as mentioned above, it is difficult to manufacture the heat conducting member 9 which has a shape corresponding accurately to the complicated structure of the conduit 4 and assemble the heat conducting member 9 in an accurate alignment, there is also a possibility that it may lead to problems, such as increase in manufacturing cost and/or decrease in manufacturing efficiency of the vaporizer 1.

Then, as a result of wholeheartedly research, the inventor has found out that the above-mentioned problems can be solved by configuring the heat conducting member 9 such that the length of the heat conducting member 9 can change flexibly according to the position of the segment of the conduit 4, which needs to be heated.

Namely, in the vaporizer 1 according to further another preferable modification 3-3 of the third embodiment of the present invention, the heat conducting member 9 comprises a movable head 9d energized toward the conduit 4. Furthermore, the movable head 9d is in direct contact with the conduit 4 or a member in direct contact with the conduit 4.

The movable range (movable distance toward the conduit 4) of the movable head 9d and the range of action of the energizing force toward the conduit 4 (range of the position of the movable head 9d, at which the energizing force can act toward (in a direction approaching) the conduit 4) are properly set according to the position of the conduit 4 to be contacted by the movable head 9d. Specifically, the above-mentioned movable range of the movable head 9d and range of action of the energizing force are properly set such that the energizing force toward the conduit 4 makes the movable head 9d contact with and/or press the conduit 4 in a state where the vaporizer 1 according to the modification 3-3 has been assembled.

In accordance with the modification 3-3, the movable head 9d can be made to certainly contact with the conduit 4 in a state where the vaporizer 1 has been assembled, without manufacturing the heat conducting member 9 which has a shape corresponding accurately to the complicated structure of the conduit 4 and assembling the heat conducting member 9 in an accurate alignment. Therefore, the efficient heat transfer from the heater plate 7 to the conduit 4 can be attained, while reducing problems, such as increase in manufacturing cost and/or decrease in manufacturing efficiency of the vaporizer 1, for example.

As a specific example of the vaporizer 1 according to the modification 3-3, the vaporizer 1, in which the heat conducting member 9 comprises the movable head 9d and a body part in contact with the heater plate 7, and the movable head 9d is configured to be able to slide while being in contact with the body part and energized toward the conduit 4 by an elastic body, can be mentioned, for example.

Figure 6:
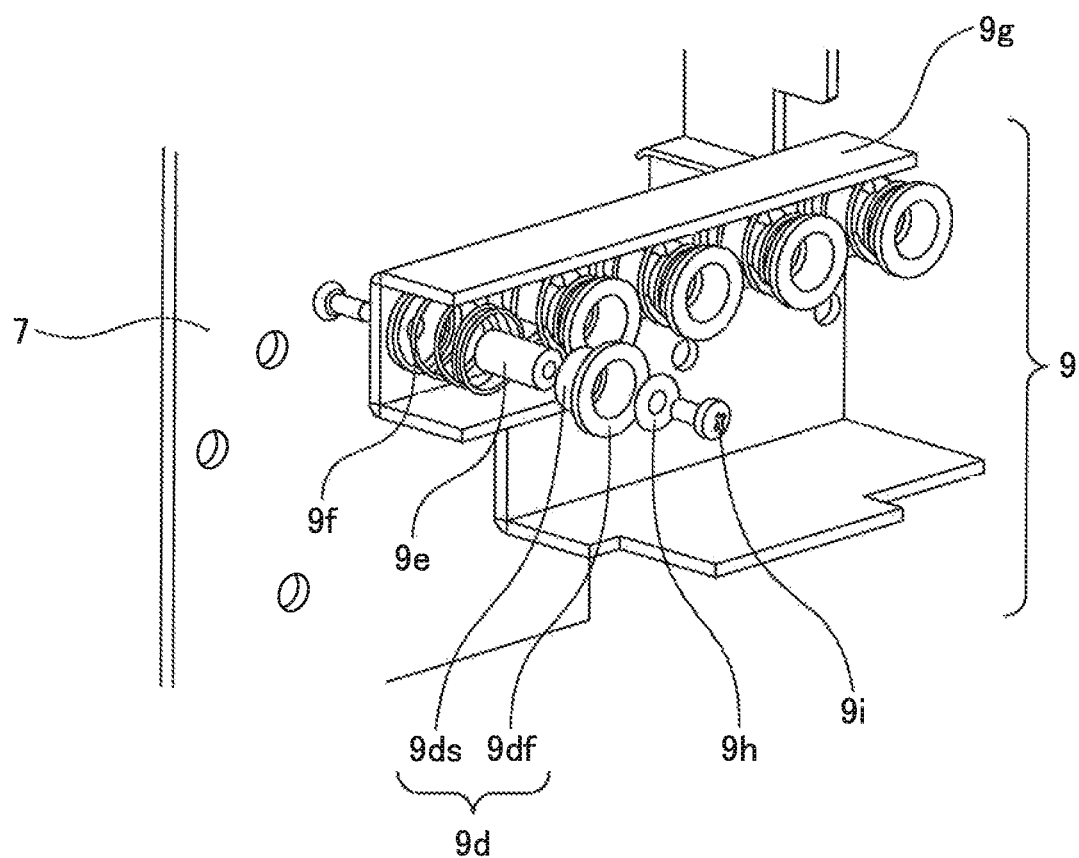
FIG. 6 is a perspective view for showing an example of a configuration of a heat conducting member which the vaporizer according to the present invention comprises.

FIG. 6 is a perspective view for showing an example of a configuration of the heat conducting member 9 which the vaporizer 1 according to the modification 3-3 comprises. The heat conducting member 9 shown in FIG. 6 comprises a columnar body part 9e and the movable head 9d which has a cylindrical sleeve 9ds and a flange 9df formed at a leading end (tip) of the sleeve 9ds (namely, end portion of the conduit 4). Furthermore, the body part 9e is inserted in the sleeve 9ds, and the inner side of the sleeve 9ds and the outer side of the body part 9e are configured to be able to slide at least partially in contact with each other. In addition, the heat conducting member 9 comprises an elastic body 9f consisting of a helical spring which has a diameter larger than the outer diameter of the sleeve 9ds and smaller than the outer diameter of the flange 9df, and the sleeve 9ds and the body part 9e are arranged approximately coaxially in the inside of the elastic body 9f.

In this example, one end of the body part 9e is fixed to the heater plate 7 through the heat conducting member fixing base 9g, and the elastic body 9f is compressed and arranged between the heat conducting member fixing base 9g and the flange 9df. Thereby, the movable head 9d is energized toward (in a direction approaching) the conduit 4 by the elastic body 9f. Furthermore, a level difference part is formed in the inner wall of the sleeve 9ds, and the sleeve 9ds is configured such that the inner diameter of the sleeve 9ds on its tip side of the level difference part is larger than the inner diameter of the sleeve 9ds on the heater plate 7 side of the level difference part. In addition, a washer 9h having an outer diameter which is smaller than the inner diameter of the sleeve 9ds on its tip side and larger than the inner diameter of the sleeve 9ds on the heater plate 7 side is fixed at a leading end of the body part 9e (namely, end portion on the conduit 4 side) with a bolt 9i. Thereby, the movable head 9d is prevented from dropping out of the body part 9e with the energizing force by the elastic body 9f.

In this example, five heat conducting members 9 are constituted using one common heat conducting member fixing base 9g. However, in the vaporizer 1 according to the present invention, one or more heat conducting members 9 may be constituted for each of the plurality of the heat conducting member fixing bases 9g. Moreover, the elastic body 9f is not limited in particular as long as the elastic body 9f has durability against operating conditions (for example, temperature, etc.) of the vaporizer 1 and can energize the movable head 9d toward (in a direction approaching) the conduit 4, and any elastic bodies other than the above-mentioned helical spring (for example, a blade spring and rubber, etc.) may be used as the elastic body 9f. Furthermore, although the heat conducting member 9 which comprises the columnar body part 9e and the movable head 9d having the cylindrical sleeve 9ds and the flange 9df formed at a leading end (tip) of the sleeve 9ds is exemplified in this example, specific configuration of the heat conducting member 9 is not limited to this exemplification. For example, the heat conducting member 9 may be constituted by a cylindrical body part and a columnar shaft part slidably inserted in the cylindrical body part and a moving part which has a head part formed at a leading end of the shaft part.

Figure 7:
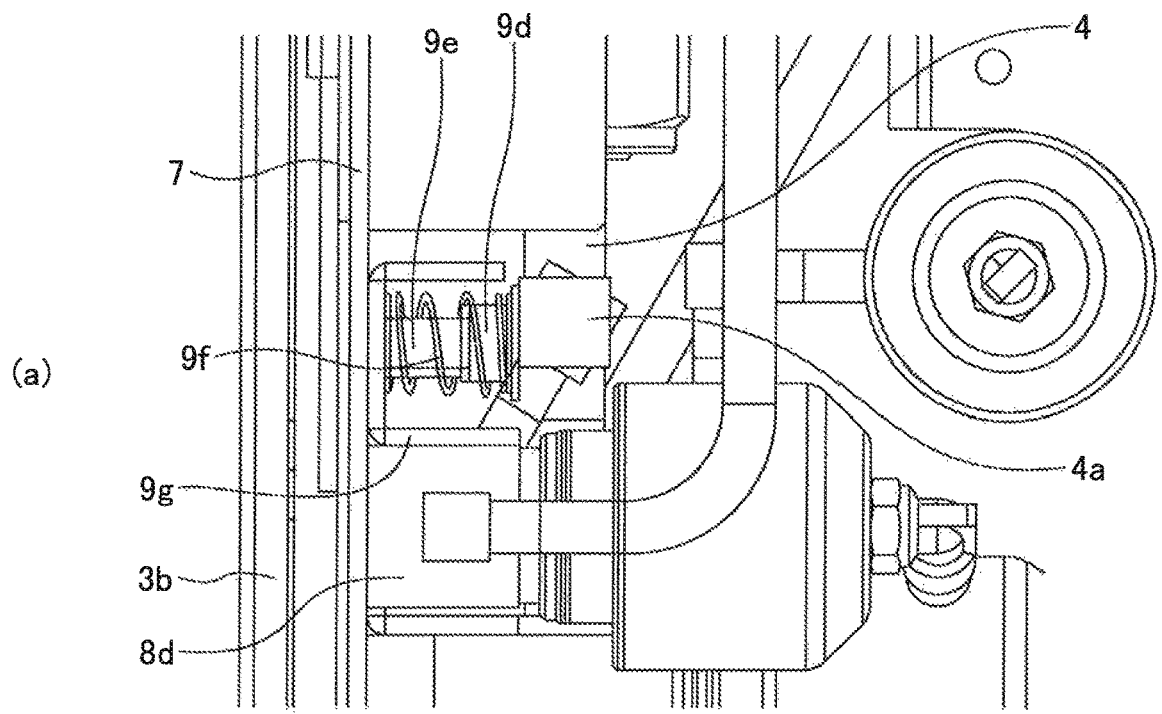
FIG. 7 includes (a) a right side view and (b) a perspective view for showing an example of the configuration of the heat conducting member incorporated in the vaporizer according to the present invention.
Figure 7:
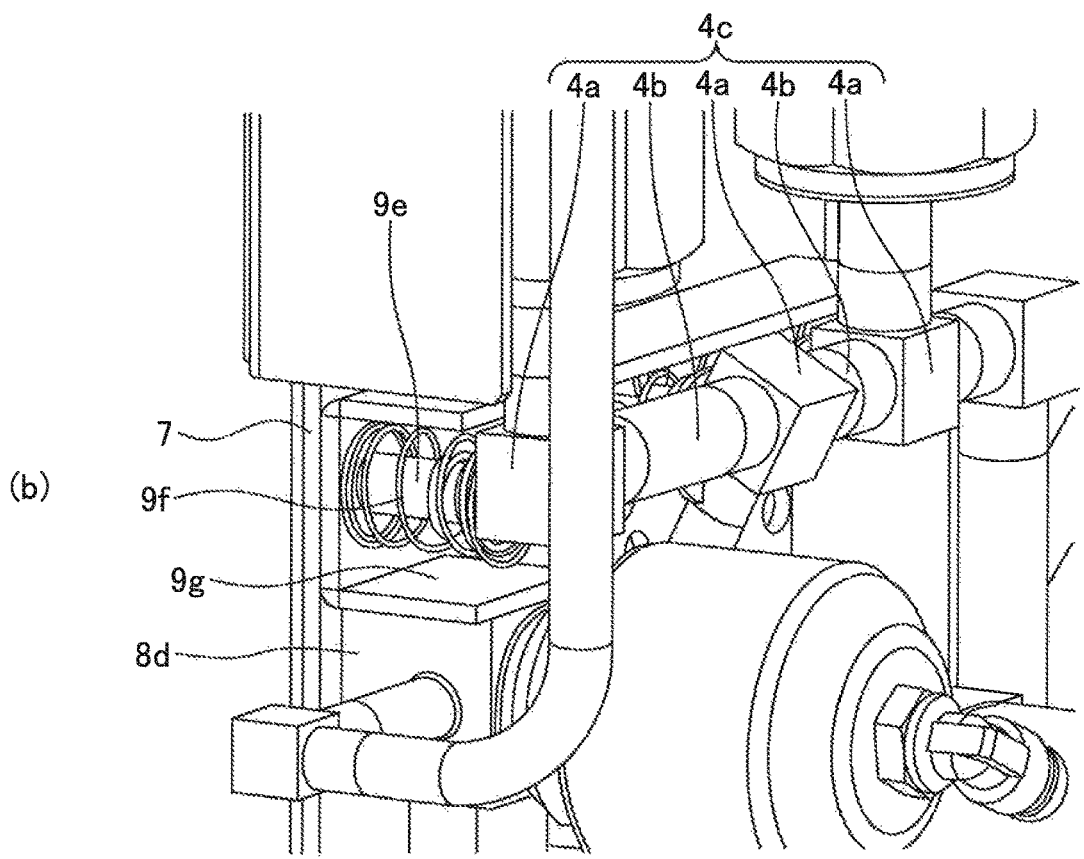

Next, FIG. 7 includes (a) a right side view and (b) a perspective view for showing an example of a state where the heat conducting member 9 shown in FIG. 6 is incorporated in the vaporizer 1. As mentioned above, the movable head 9d is configured to be able to slide in contact with the body part 9e within a predetermined movable range and is energized toward (in a direction approaching) the conduit 4 by the elastic body 9f. Therefore, as long as segment of the conduit 4 to be contacted by the movable head 9d in a state where incorporated in the vaporizer 1, etc. is located within the movable range of the movable head 9d, the movable head 9d can be made to certainly contact with the conduit 4 without manufacturing the heat conducting member 9 which has a shape corresponding accurately to the structure of the conduit 4 and accurately aligning the heat conducting member 9 with the conduit 4.

In the example shown in FIG. 7, the leading ends of five movable heads 9d are energized by the elastic bodies 9f, and pressed to respective segments of a manifold 4c consisting of a plurality of piping 4b which constitute the conduit 4 and a plurality of joint blocks 4a which connect these piping 4b, respectively. Thereby, the five movable heads 9d are in direct contact with the piping 4b which constitute the conduit 4 and the joint blocks 4a which connects these piping 4b, respectively. Namely, the movable heads 9d contact directly with the conduit 4 or the members in direct contact with the conduit 4. As a result, efficient heat transfer from the heater plate 7 to the conduit 4 can be attained, while reducing problems, such as increase in manufacturing cost and/or decrease in manufacturing efficiency of the vaporizer 1, for example.

In the example shown in FIG. 7, all the conduits 4 and joint blocks with which the five movable heads 9d contact, are arranged at almost the same distance from the heater plate 7. However, the movable head 9d can also be made to contact with the conduit 4 arranged at various distances from the heater plate 7, etc. by changing the length of the body part 9e constituting each of the heat conducting member 9 and/or the length of the sleeve 9ds, etc.

Moreover, as shown in FIG. 6 and FIG. 7, the heat conducting member fixing base 9g in this example is a member which has an approximately U-character shaped variant cross section and is formed of aluminum-based material, and an outer surface 9c on the lower side in a vertical direction in the drawings is in contact with a side surface of a joint block 8d of the valve, which contacts closely with the heater plate 7. Namely, the heat conducting member fixing base 9g in this example functions also as a heat conducting member which transmits heat to the valve from the heater plate 7. Thus, the vaporizer 1 according to the present invention may further comprise a heat conducting member which transmits heat to the valve from the heater plate 7, or both the function to transmit heat to the conduit 4 from the heater plate 7 and the function to transmit heat to the valve from the heater plate 7 may be attained by one heat conducting member.

Fourth Embodiment

In the vaporizer according to a preferable embodiment of the present invention, the flow rate measuring means 5 is a mass flow meter or a mass flow controller. As mentioned above, as a mass flow meter, a well-known thermal type mass flow meter or a pressure type mass flow meter can be used. Since a mass flow meter can measure a flow rate of gas precisely, the quantity of gas supplied from the vaporizer 1 can be managed accurately. A mass flow controller is an apparatus in which a valve and a control circuit for controlling a flow rate of gas is added to a mass flow meter. When using a mass flow controller, a flow rate of gas supplied from the vaporizer 1 can be controlled to approach a predetermined target flow rate. Moreover, the valve 8 of the vaporizer 1 can be omitted by using a valve prepared in a mass flow controller. Namely, a valve which a mass flow controller comprises can be used as the valve 8 of the vaporizer 1.

Working Example

Configuration

Figure 8:
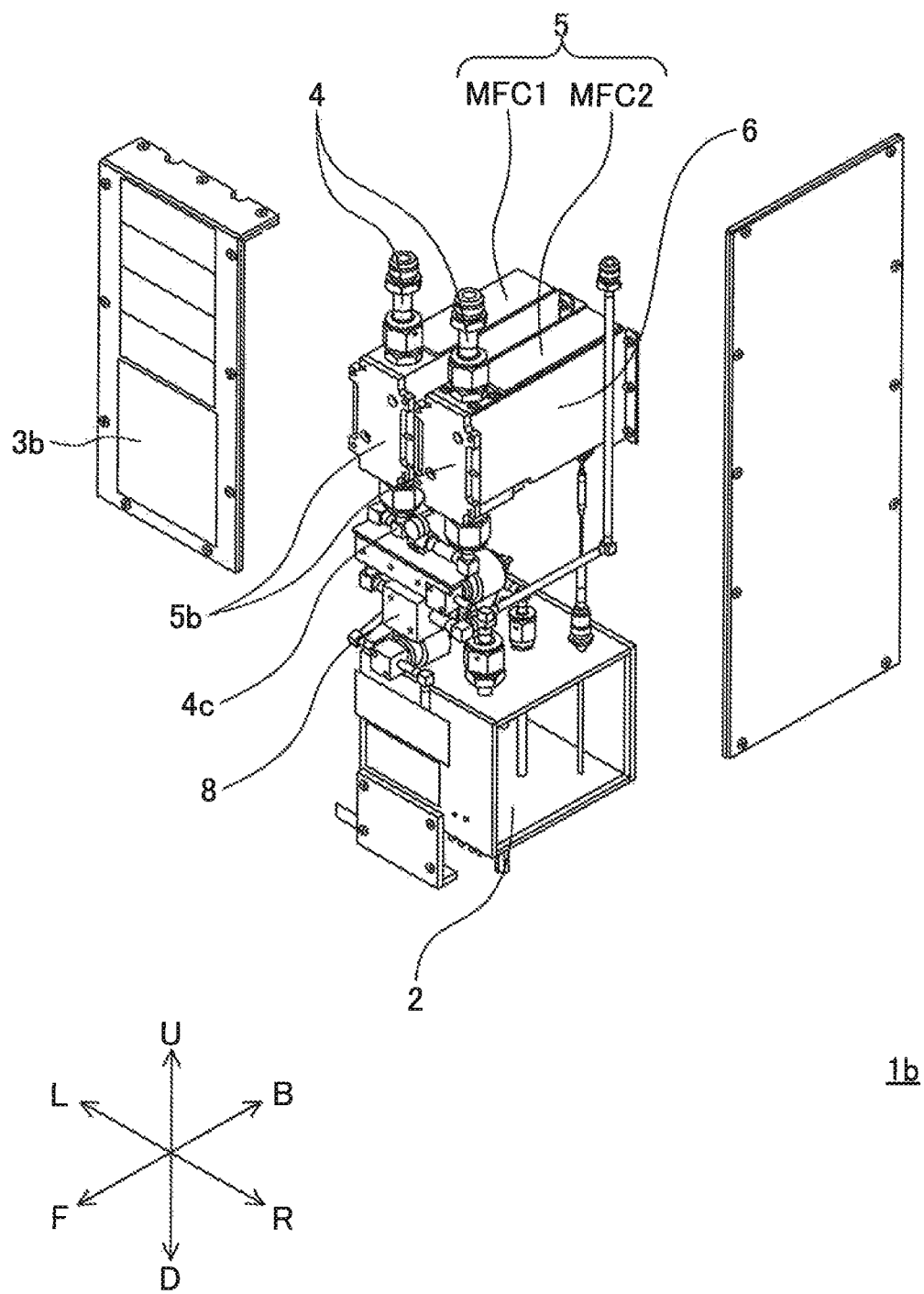
FIG. 8 is a perspective view for showing an example of the configuration of a vaporizer according to a working example of the present invention.

Hereafter, a configuration of the vaporizer 1b according to a working example of the present invention will be explained. FIG. 8 is a perspective view for showing an example of the configuration of the vaporizer 1b. In the explanation about FIG. 8, as indicated by a plurality of arrows in the drawing, the front side of the vaporizer 1b may be referred to as an "F side", the back side thereof may be referred to as a "B side", the right hand side thereof may be referred to as an "R side", the left hand side thereof may be referred to as an "L side", the upper side thereof may be referred to as a "U side", and the bottom side thereof may be referred to as a "D side", respectively. Moreover, for the purpose of making it easy to understand the configuration of the vaporizer 1b, a part of the cabinet 3 and the heater plate 7 are omitted. However, the detachable panel 3b that is a removable panel of the cabinet 3 and a panel which constitutes the right side surface (surface on the R side) are illustrated apart from other component parts of the vaporizer 1b.

The vaporizer 1b comprises a tank 2 in which liquid material is heated to generate gas, a cabinet 3 (a part thereof is not shown) which houses the tank 2, a conduit 4 which supplies the gas to the outside of the cabinet 3, a flow rate measuring means 5 which measures a flow rate of the gas flowing through the conduit 4, and a heater plate 7 (not shown) which heats the conduit 4. The cabinet 3 comprises a detachable panel 3b that is a panel which can be removed.

Moreover, the vaporizer 1b comprises a first support member 6 which is fixed directly to a mounting panel 3c (not shown) of the cabinet. The flow rate measuring means 5 is supported by the first support member 6, and the heater plate 7 (not shown) is supported between the flow rate measuring means 5 and the detachable panel 3b by the first support member 6.

Furthermore, a valve 8 which starts and stops supply of the gas is interposed between the tank 2 and the flow rate measuring means 5. By adjusting the opening of the valve 8, a suitable quantity of the gas can be supplied to a semiconductor producing apparatus, etc., at a suitable timing. In addition, the valve 8 which the vaporizer 1b comprises is the above-mentioned diaphragm valve.

In accordance with the above-mentioned configuration, the flow rate measuring means 5 and/or the valve 8 can be mounted on and removed from the vaporizer 1b in a space opened wide after removing the detachable panel 3b of the cabinet 3. Moreover, since both portions where the first support member 6 is fixed with the heater plate 7 and the first support member 6 is fixed with the flow rate measuring means 5 are exposed to the detachable panel 3b side, a tool, such as a screwdriver, can reach easily. Therefore, in the vaporizer 1b according to the working example of the present invention, as compared with the vaporizer 1a according to the prior art, the flow rate measuring means 5 and/or the valve 8 can be mounted and removed more easily.

In addition, the vaporizer 1b comprises a flow rate measuring means fixing base 5b between the flow rate measuring means 5 and the heater plate 7, and the flow rate measuring means 5 is supported through the flow rate measuring means fixing base 5b by the first support member 6. Moreover, the vaporizer 1b comprises a valve fixing base 8b between the valve 8 and the heater plate 7, and the valve 8 is fixed to the heater plate 7 through the valve fixing base 8b. In accordance with these configurations, the heat generated by the heater plate 7 is efficiently transmitted to the flow rate measuring means 5 and the valve 8, and condensation of the gas in the flow rate measuring means 5 and the valve 8 can be prevented more certainly.

As shown in FIG. 8, the vaporizer 1b comprises two mass flow controllers MFC1 and MFC2 arranged in parallel on the left hand side (L side) and the right hand side (R side) as the flow rate measuring means 5. Namely, in the vaporizer 1b, two sets of gas supply lines comprising one conduit 4, one flow rate measuring means 5 (the mass flow controllers MFC1 or MFC2) and one first support member 6 are prepared in the inside of the cabinet 3. Moreover, one common valve 8 is interposed on the upstream side of a manifold 4c branched to these two sets of gas supply lines. Namely, the vaporizer 1b has a configuration corresponding to the above-mentioned modification 2-3. In addition, although piping for supplying purge gas for purging gas of liquid material to the vaporizer 1b and piping for supplying the liquid material to the tank 2, etc., for example, are illustrated in FIG. 8, explanation about these piping is omitted here since it is well known to a person skilled in the art.

Measurement of Temperature Difference in Vaporizer

As mentioned above, when the temperature of the conduit 4 is lower than the dew point of the gas generated from the liquid material in the tank 2, there is a possibility that the gas may be condensed and returned to liquid in the inside of the conduit 4. When the gas is thus condensed in the inside of the conduit 4, there is a possibility that the concentration of the gas supplied by the vaporizer may be changed or supply of the gas may stop. In order to reduce such problems certainly, it is important to decrease unevenness of temperature in a supply route of the gas including the conduit 4, the flow rate measuring means 5 and the valve 8 which are heated with the heater plate 7. Therefore, temperature of a plurality of positions inside the cabinet 3 in the vaporizers 1b according to this working example and its modifications is measured.

A vaporizer according to a working example 1 is the vaporizer 1b which has a configuration corresponding to the above-mentioned modification 2-3. In addition, the valve 8 is directly supported by a part of the valve fixing bases 8b being fixed to a panel which constitutes the detachable panel 3b of the cabinet 3. In addition, the vaporizer according to the working example 1 does not comprise the heat conducting member 9.

A vaporizer according to a working example 2 has the same configuration as the vaporizer according to the working example 1, except for a point that the vaporizer comprises the same heat conducting member 9 as the vaporizer 1 according to the above-mentioned modification 3-1. Specifically, the vaporizer according to the working example 2 comprises the radiation type heat conducting member 9 shown in FIG. 5, and is configured to conduct heat to the conduit 4 from the heater plate 7 by radiation from a leading end part of the heat conducting member 9.

A vaporizer according to a working example 3 has the same configuration as the vaporizer according to the working example 1, except for a point that the vaporizer comprises the same heat conducting member 9 as the vaporizer 1 according to the above-mentioned modification 3-3. Specifically, the vaporizer according to the working example 3 comprises a contact type heat conducting member 9, the heat conducting member 9 comprises the movable head 9d and the body part 9e in contact with the heater plate 7, the movable head 9d is configured to be able to slide while being in contact with the body part and energized toward the conduit 4 by an elastic body, and the movable head 9d is in contact with the conduit 4, as shown in FIG. 6 and FIG. 7. Thereby, the vaporizer according to the working example 3 is configured to conduct heat to the conduit 4 from the heater plate 7 by heat conduction through the heat conducting member 9 in contact with both the conduit 4 and the heater plate 7.

A vaporizer according to a working example 4 has the same configuration as the vaporizer according to the working example 3, except for a point that the valve 8 is indirectly supported through the same second support member 8c as the vaporizer 1 according to the above-mentioned modification 2-6. Specifically, in the vaporizer according to the working example 4, the valve 8 is not directly supported by a part of the valve fixing bases 8b being fixed to a panel constituting the detachable panel 3b of the cabinet 3 as in the vaporizers according to the working example 1 to the working example 3. Instead, the valve 8 is supported by the second support member 8c which has a configuration as shown in FIG. 4 and cannot conduct heat easily.

For each of four kinds of the vaporizers according to the working example 1 to the working example 4, which have the configurations as mentioned above, the temperature of the side surface (an E point) of the joint block on the inlet side of the mass flow controller MFC2 arranged on the right hand side (R side) among the above-mentioned two flow rate measuring means 5 is controlled to be 90° C. While maintaining this state, the temperature of six positions (temperature measuring points) of an A point to an F point listed below is measured respectively, and the temperature differences between the E point and each of the temperature measuring points are obtained.

(A) A central part of the side surface of the valve joint block 8a

(B) An upstream side of the manifold 4c (piping communicated with the valve 8)

(C) A branching point of the manifold 4c

(D) A central part of the side surface of the joint block 5a on the inlet side of the mass flow controller MFC1 (L side)

(E) A central part of the side surface of the joint block 5a on the inlet side of the mass flow controller MFC2 (R side)

(F) A piping on the outlet side of the mass flow controller MFC2 (R side)

Figure 9:
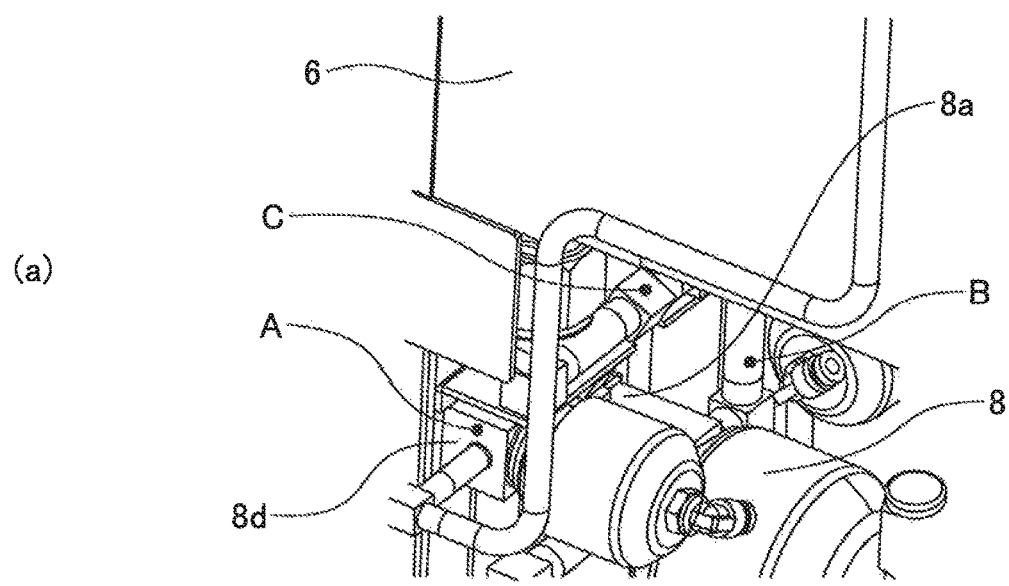
FIG. 9 is a perspective view for showing temperature measuring points in a vaporizer according to the working example of the present invention.
Figure 9:
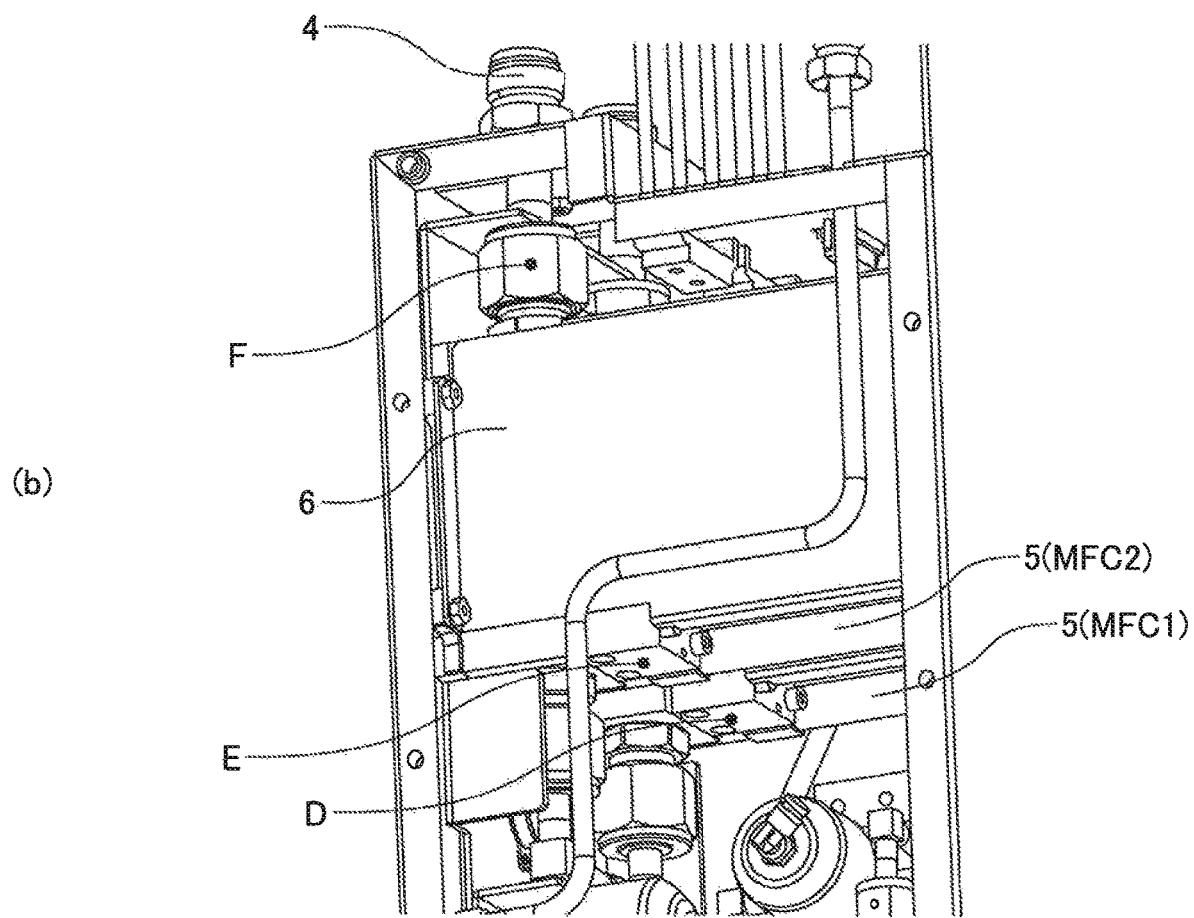
Figure 10:
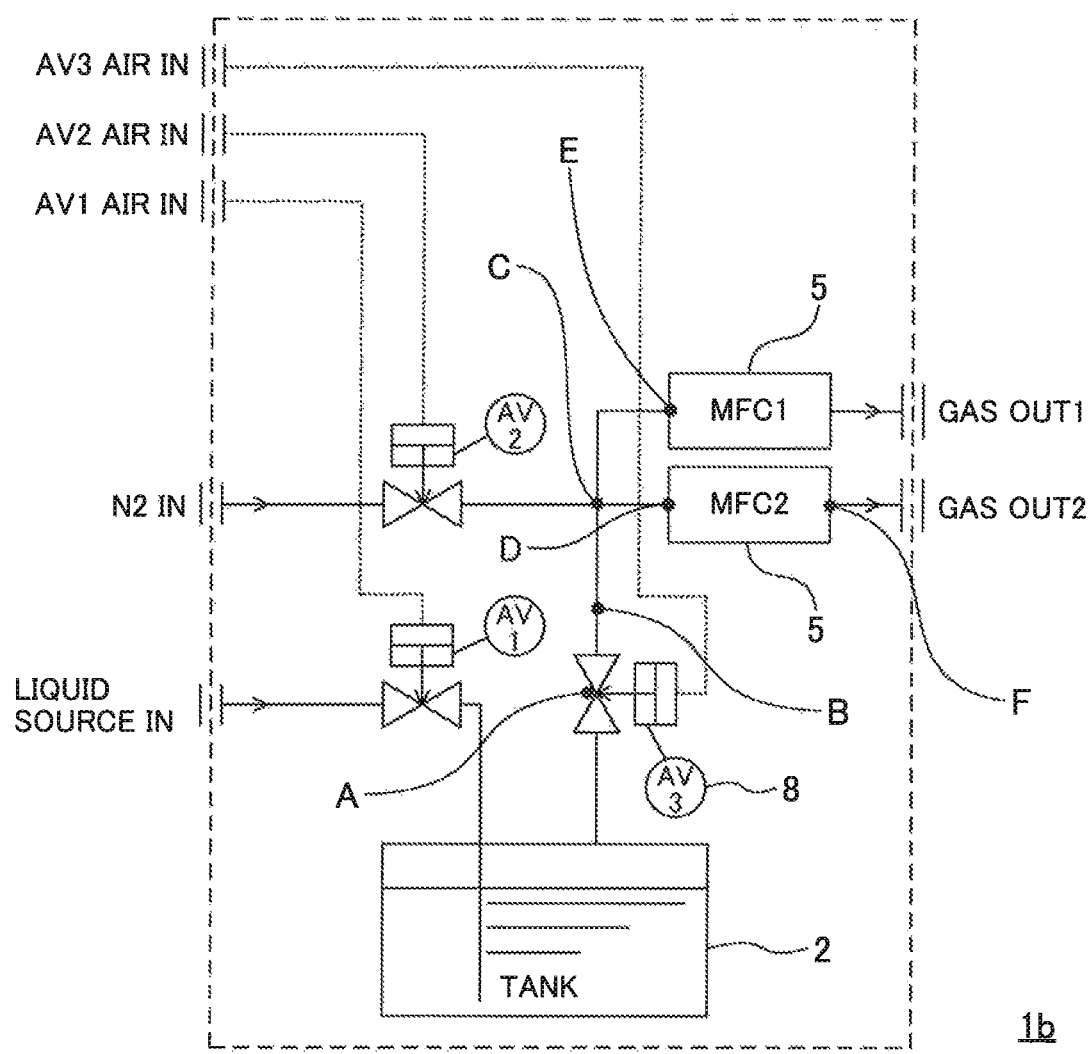
FIG. 10 is a schematic block diagram for showing the temperature measuring points in a vaporizer according to a working example of the present invention.

In addition, the above-mentioned six temperature measuring points (the A point to the F point) is shown in FIG. 9 and FIG. 10. FIG. 9 is a perspective view for showing respective temperature measuring points in the vaporizer 1b according to the working example of the present invention. Moreover, FIG. 10 is a schematic block diagram for showing the temperature measuring points in the vaporizer 1b.

The temperature difference $\Delta T$ between each temperature of the A point to the F point measured as mentioned above and that of the E point (=the temperature of each temperature measuring point—the temperature of the E point) and the maximum value ΔTmax in each of the working example 1 to the working example 4 are listed to the following Table 1.

TABLE 1

|  |  | WE1 | WE2 | WE3 | WE4 |
|---|---|---|---|---|---|
| Heat Conducting Member |  | None | Radiation Type | Contact Type | Contact Type |
| Valve Support |  | Direct | Direct | Direct | Indirect |
| ΔT [° C.] | A | −16.9 | −9.1 | −8.8 | −5.3 |
|  | B | −4.1 | −8.8 | −9.5 | −7.8 |
|  | C | −4.5 | −9.4 | −8.0 | −2.9 |
|  | D | −0.1 | +0.5 | +1.0 | −1.1 |
|  | E | 0.0 | 0.0 | 0.0 | 0.0 |
|  | F | +2.3 | +0.4 | +1.1 | −1.9 |
| ΔTmax [° C.] |  | −16.9 | −9.4 | −9.5 | −7.8 |

* "WE" = "Working Example"

Evaluation

In any of the vaporizers according to the working example 1 to the working example 4, similarly to the vaporizers according to other embodiment of the present invention, the heat generated by the heater plate 7 is transmitted to the flow rate measuring means 5 and the valve 8 through the flow rate measuring means fixing base 5b and the valve fixing base 8b. Therefore, the possibility that the gas may be condensed and returned to liquid in the inside of the conduit 4 can be reduced.

However, as shown in Table 1, in the vaporizer according to the working example 1, as compared with the vaporizers according to the working example 2 to the working example 4, variation in temperature among the six temperature measuring points is large, and especially the temperature difference ΔT between the A point and the E point as a reference is remarkably large (ΔTmax=−16.9° C.). In such a state, a possibility that gas in the vicinity of the A point may be condensed and returning to liquid is high. This is considered to be ascribed to that the vaporizer according to the working example 1 does not comprise the heat conducting member 9 as mentioned above and, in addition, the valve 8 is supported by a part of the valve fixing bases 8b being fixed directly to the panel which constitutes the detachable panel 3b of the cabinet 3. Specifically, it is considered that the conduit 4 cannot be heated and kept warm (or hot) sufficiently as compared with the vaporizers according to the working example 2 to the working example 4 since the vaporizer according to the working example 1 does not comprise the heat conducting member 9. In addition, it is considered that the heat transmitted to the valve fixing base 8b from the heater plate 7 is emitted to the outside of the cabinet 3 and the valve 8 cannot be heated sufficiently since the valve 8 is fixed directly to the panel which constitutes the detachable panel 3b of the cabinet 3.

On the other hand, unlike the vaporizer according to the working example 1, the vaporizers according to the working example 2 and the working example 3 comprise the radiation type and contact type heat conducting members 9, respectively. As a result, in the vaporizers according to the working example 2 and the working example 3, as compared with the vaporizer according to the working example 1, the variation in temperature among the six temperature measuring points is small, and the maximum values ΔTmax of the temperature difference ΔT between each temperature measuring point and the E point as a reference decreased largely (ΔTmax=−9.4° C. and ΔTmax=−9.5° C., respectively). Therefore, in the vaporizers according to the working example 2 and the working example 3, as compared with the vaporizer according to the working example 1, a possibility that gas is condensed and returned to liquid in the inside of the conduit 4 is low.

Furthermore, in the vaporizer according to the working example 4, as compared with the vaporizers according to the working example 1 to the working example 3, the temperature difference ΔT among the A point to the C point became further smaller, and the maximum value ΔTmax of the temperature difference ΔT between each temperature measuring point and the E point as a reference became further smaller. This is considered to be ascribed to that the emission to the outside of the cabinet 3 of the heat transmitted to the valve 8 from the heater plate 7 was suppressed since the valve 8 is supported by the second support member 8c which cannot transmit heat easily in the vaporizer according to the working example 4 as mentioned above.

CONCLUSION

As apparent from the above-mentioned explanation about the working examples of the present invention, in accordance with the present invention, a vaporizer, in which the flow rate measuring means and the valve installed in the vaporizer can be easily removed and/or installed again for the purpose of inspection or repair, etc., even when the width of the vaporizer is narrowed and/or a plurality of gas supply lines are prepared in the inside of the vaporizer. Moreover, by further comprising a heat conducting member which conducts heat to the conduit 4 from the heater plate 7, the heat of the heater plate 7 can be transmitted to the conduit 4 to prevent drop in the temperature of gas even when the conduit 4 is long.

Furthermore, by fixing the valve 8 to the cabinet 3 at a position other than the detachable panel 3b through the second support member 8c which cannot transmit heat easily, even when it is difficult to support the valve 8 by the junction with the conduit 4 since the capacity of the valve 8 is large, the valve 8 can be certainly supported, and the emission of the heat transmitted to the valve 8 from the heater plate 7 to the outside of the cabinet 3 can be suppressed, and condensation of the gas in the valve 8 can be prevented effectively.

Although some the embodiments, modifications and working examples having specific configurations have been explained sometimes referring to the accompanying drawings as mentioned above, for the purpose of explaining the present invention, it should not be interpreted that the scope of the present invention is limited to these exemplary embodiments, modifications and working examples, and it is needless to say that any correction can be suitably added within the limits of the matters described in the claims and the specification.

REFERENCE SIGNS LIST

1: Vaporizer
  1a: Vaporizer (Prior Art)
  1b: Vaporizer (Working Example)
2: Tank
  2a: Tank Heater
3: Cabinet
  3a: Heat Insulator
  3b: Detachable Panel
  3c: Mounting Panel
4: Conduit
  4a: Conduit Joint Block
  4b: Piping 4c: Manifold
5: Flow Rate Measuring Means
  5a: Flow Rate Measuring Means Joint Block
  5b Flow Rate Measuring Means Fixing Base
6: First Support Member
7: Heater Plate
8: Valve
  8a: Valve Joint Block
  8b: Valve Fixing Base
  8c: Second Support Member
  8cs: Spacer
  8d: Valve Joint Block
9: Heat Conducting Member
  9a: Outer Surface (end portion closer to heater plate)
  9b: Outer Surface (end portion further from heater plate)
  9c: Outer Surface (outer surface in contact with valve joint block)
  9d: Movable Head
  9ds: Sleeve
  9df: Flange
  9e: Body Part
  9f: Elastic Body (spring)
  9g: Heat Conducting Member Fixing Base
  9h: Washer
  9i: Bolt

The invention claimed is:

1. A vaporizer comprising:
a tank in which liquid material is heated to generate gas,
a cabinet which houses said tank,
a conduit which supplies said gas to the outside of said cabinet,
a flow rate measuring means which measures a flow rate of said gas flowing through said conduit, and
a heater plate which heats said conduit, the heater plate is separate from a tank heater that heats said liquid material stored in said tank, and
a part of panels defining said cabinet is constituted by a detachable panel that is a panel which can be removed, wherein:
a first support member is fixed directly or indirectly to said cabinet at a position other than said detachable panel,
said flow rate measuring means is supported by said first support member, and
said heater plate is supported between said flow rate measuring means and said detachable panel by said first support member such that said heater plate is exposed when said detachable panel is removed and said flow rate measuring means is exposed when said heater plate is removed.

2. The vaporizer according to claim 1, wherein at least a junction of said flow rate measuring means and said conduit is arranged at a position closer to said detachable panel than to an opposing surface that is a surface opposed to said detachable panel of said cabinet.

3. The vaporizer according to claim 1, wherein said flow rate measuring means is a mass flow meter or a mass flow controller.

4. The vaporizer according to claim 1, comprising a flow rate measuring means fixing base between said flow rate measuring means and said heater plate, wherein said flow rate measuring means is supported through said flow rate measuring means fixing base by said first support member.

5. The vaporizer according to claim 4, comprising a flow rate measuring means joint block between said flow rate measuring means and said flow rate measuring means fixing base, wherein said conduit is joined with said flow rate measuring means joint block.

6. The vaporizer according to claim 1, comprising one or more heat conducting members which conduct heat to said conduit from said heater plate.

7. The vaporizer according to claim 6, wherein said heat conducting member is configured such that end portions further from said heater plate of said heat conducting members are in direct contact with neither said conduit nor members in direct contact with said conduit and heat is conducted to said conduit from said heater plate by radiation from said end portions.

8. The vaporizer according to claim 6, wherein said heat conducting member is configured to be in contact with both of said conduit and said heater plate.

9. The vaporizer according to claim 8, wherein:
said heat conducting member comprises a movable head energized toward said conduit, and
said movable head is in direct contact with said conduit or a member in direct contact with said conduit.

10. The vaporizer according to claim 9, wherein:
said heat conducting member comprises said movable head and a body part in contact with said heater plate, and
said movable head is configured to be able to slide while being in contact with said body part and energized toward said conduit by an elastic body.

11. The vaporizer according to claim 1, comprising a valve which is disposed between said tank and said flow rate measuring means to start and stop supply of said gas.

12. The vaporizer according to claim 11, wherein a plurality of sets of gas supply lines comprising a conduit, a flow rate measuring means, a first support member, and a valve are prepared in the inside of said cabinet.

13. The vaporizer according to claim 11, comprising a valve fixing base between said valve and said heater plate, wherein said valve is fixed to said heater plate through said valve fixing base.

14. The vaporizer according to claim 13, comprising a valve joint block between said valve and said valve fixing base, wherein said conduit is joined with said valve joint block.

15. The vaporizer according to claim 13, comprising a second support member fixed directly or indirectly to said cabinet at a position other than said detachable panel, wherein:
said valve is supported directly or indirectly by said second support member, and
said second support member is configured such that the quantity of heat transferred to said cabinet from said valve through said second support member is smaller than the quantity of heat transferred to said valve from said heater plate through said valve fixing base.

16. The vaporizer according to claim 15, wherein:
said second support member is constituted by material which has a thermal conductivity smaller than a thermal conductivity of material constituting said valve fixing base, and/or
said second support member is configured such that the minimum value of the cross section of a heat flow path through said second support member is smaller than the minimum value of the cross section of a heat flow path through said valve fixing base.

17. The vaporizer according to claim 16, wherein said second support member is configured to support said valve at an end surface of said valve fixing base on the side of said valve or at a position closer to said valve than said end surface.

* * * * *